United States Patent
Maki et al.

(10) Patent No.: US 12,176,227 B2
(45) Date of Patent: Dec. 24, 2024

(54) STATE DETERMINATION DEVICE, STATE DETERMINATION METHOD, AND COMPUTER-READABLE RECORDING MEDIUM

(71) Applicant: TOKYO ELECTRON LIMITED, Tokyo (JP)

(72) Inventors: Junnosuke Maki, Koshi (JP); Masaomi Toyonaga, Koshi (JP); Atsushi Ohta, Sapporo (JP); Motoi Okada, Sapporo (JP); Takuro Tsutsui, Sapporo (JP); Kei Sano, Sapporo (JP); Mistsuteru Yano, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 593 days.

(21) Appl. No.: 17/598,077

(22) PCT Filed: Mar. 18, 2020

(86) PCT No.: PCT/JP2020/012127
§ 371 (c)(1),
(2) Date: Sep. 24, 2021

(87) PCT Pub. No.: WO2020/196195
PCT Pub. Date: Oct. 1, 2020

(65) Prior Publication Data
US 2022/0223443 A1 Jul. 14, 2022

(30) Foreign Application Priority Data
Mar. 26, 2019 (JP) .................................. 2019-058391

(51) Int. Cl.
*H01L 21/67* (2006.01)
*G01L 5/00* (2006.01)
*G05B 19/4155* (2006.01)

(52) U.S. Cl.
CPC .......... *H01L 21/67276* (2013.01); *G01L 5/00* (2013.01); *G05B 19/4155* (2013.01); *G05B 2219/45031* (2013.01)

(58) Field of Classification Search
CPC .................. G01L 5/00; G05B 19/4155; G05B 2219/45031; G05B 2219/45054;
(Continued)

(56) References Cited

U.S. PATENT DOCUMENTS

2019/0378740 A1* 12/2019 Isokawa ............ H01L 21/67196
2020/0082245 A1* 3/2020 Hao ......................... G06N 3/04
(Continued)

FOREIGN PATENT DOCUMENTS

JP   H5-69951 U    9/1993
JP   H9-274535 A   10/1997
(Continued)

*Primary Examiner* — Son T Le
*Assistant Examiner* — Matthew W. Baca
(74) *Attorney, Agent, or Firm* — Nath, Goldberg & Meyer; Jerald L. Meyer; Tanya E. Harkins

(57) ABSTRACT

A state determination device determines the state of a drive mechanism configured to operate while holding a substrate in a substrate processing apparatus. The state determination part includes: an acquisition part configured to acquire operation data for the drive mechanism; a model generation part configured to generate a monitoring model for the drive mechanism by executing machine learning using an autoencoder based on normal operation data that is derived from the operation data acquired by the acquisition part when the drive mechanism is operating normally; and a first determination part configured to determine the state of the drive mechanism based on first output data obtained by inputting, to the monitoring model, evaluation data that is derived from the operation data acquired by the acquisition part when the drive mechanism is being evaluated.

15 Claims, 15 Drawing Sheets

(58) Field of Classification Search
CPC .......... G05B 19/41885; G05B 19/4189; G05B 23/00; G05B 23/02; G05B 23/0205; G05B 23/021; G05B 23/0218; G05B 23/0221; G05B 23/0224; G05B 23/0232; G05B 23/0235; G05B 23/024; G05B 23/0243; G05B 23/0245; G05B 23/0254; G05B 23/0259; G05B 23/0262; H01L 21/00; H01L 21/67; H01L 21/677; H01L 21/67742; H01L 21/67276; G06N 3/02; G06N 3/0455; G06N 3/08; G06K 9/6251; G06F 11/3447

See application file for complete search history.

(56) References Cited

U.S. PATENT DOCUMENTS

| | | | | |
|---|---|---|---|---|
| 2020/0243359 A1* | 7/2020 | Hao | ................. | H01J 37/32889 |
| 2021/0182296 A1* | 6/2021 | Yuan | ..................... | G06N 3/047 |

FOREIGN PATENT DOCUMENTS

| | | | |
|---|---|---|---|
| JP | 2013-133192 A | | 7/2013 |
| JP | 2018147443 A | * | 9/2018 |
| JP | 2018148350 A | | 9/2018 |
| WO | 2018/147183 A1 | | 8/2018 |

* cited by examiner

STATE DETERMINATION DEVICE, STATE DETERMINATION METHOD, AND COMPUTER-READABLE RECORDING MEDIUM

This is a National Phase Application filed under 35 U.S.C. 371 as a national stage of PCT/JP2020/012127, filed Mar. 18, 2020, an application claiming the benefit of Japanese Application No. 2019-058391, filed Mar. 26, 2019, the content of each of which is hereby incorporated by reference in its entirety.

TECHNICAL FIELD

The present disclosure relates to a state determination device, a state determination method, and a computer-readable recording medium.

BACKGROUND

Patent Document 1 discloses a substrate transfer mechanism provided in a substrate processing apparatus for processing a substrate such as a semiconductor wafer. The substrate transfer mechanism is configured to be movable between different modules in the substrate processing apparatus. The transfer mechanism takes out one substrate from, for example, a carrier accommodating a plurality of substrates and moves the substrate between the carrier and a processing module to transfer the substrate to the processing module.

PRIOR ART DOCUMENTS

Patent Document

Patent Document 1: Japanese laid-open publication No. 2013-133192

SUMMARY

The present disclosure describes a state determination device, a state determination method, and a computer-readable recording medium, which are capable of determining the state of a substrate drive mechanism with ease and high accuracy.

A state determination device according to an aspect of the present disclosure determines the state of a drive mechanism configured to operate while holding a substrate in a substrate processing apparatus. The state determination device includes: an acquisition part configured to acquire operation data for the drive mechanism; a model generation part configured to generate a monitoring model for the drive mechanism by executing machine learning using an autoencoder based on normal operation data that is derived from the operation data acquired by the acquisition part when the drive mechanism is operating normally; and a first determination part configured to determine the state of the drive mechanism based on first output data obtained by inputting, to the monitoring model, evaluation data that is derived from the operation data acquired by the acquisition part when the drive mechanism is being evaluated.

With the state determination device, the state determination method, and the computer-readable recording medium according to the present disclosure, it is possible to determine the state of a substrate drive mechanism with ease and high accuracy.

DETAILED DESCRIPTION

Figure 1:
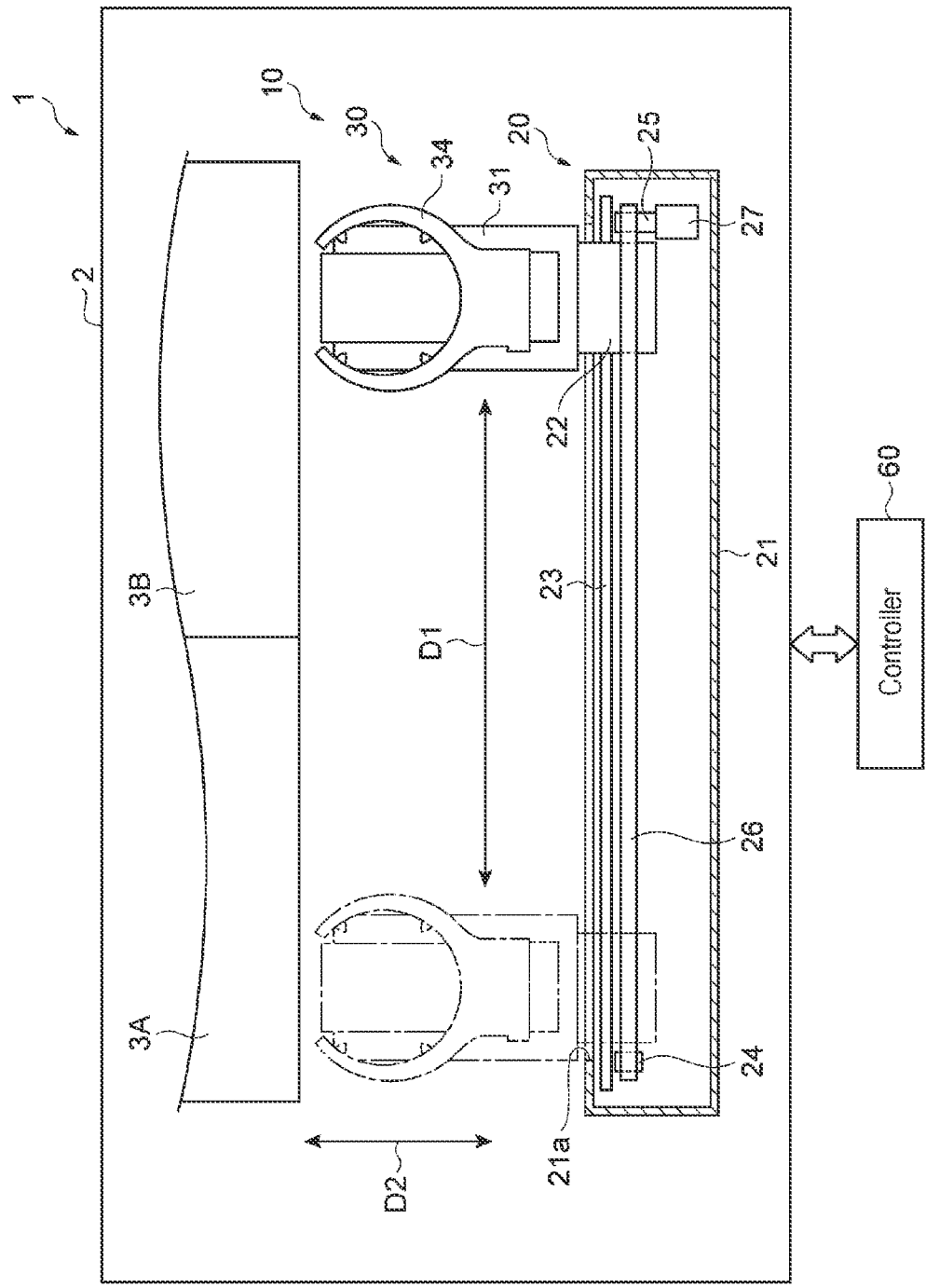
FIG. 1 is a top view schematically illustrating an example of a substrate processing system.

Hereinafter, exemplary embodiments of the present disclosure will be described in more detail with reference to the drawings. In the following description, the same reference numerals will be used for the same elements or elements having the same function, and redundant descriptions thereof will be omitted.

[Substrate Processing Apparatus]

A substrate processing system 1 illustrated in FIG. 1 is a system configured to perform substrate processing on a wafer W. The substrate processing system 1 includes a substrate processing apparatus 2 and a controller 60. The wafer W may have a disk shape, a circular shape a portion of which is cut out, or a shape other than the circular shape such as a polygonal shape. The wafer W may be, for example, a semiconductor substrate, a glass substrate, a mask substrate, a flat panel display (FPD) substrate, or various other substrates. The diameter of the wafer W may be, for example, about 200 mm to 450 mm.

As illustrated in FIG. 1, the substrate processing apparatus 2 includes processing units 3A and 3B, and a transfer device 10 (a drive mechanism). The processing units 3A and 3B are each configured to perform a predetermined process on the wafer W. The processing units 3A and 3B may be liquid processing units configured to supply a processing liquid to the surface of the wafer W. The processing units 3A and 3B may be heat treatment units configured to thermally treat (heat or cool) a coating film formed on the surface of the wafer W. The processing units 3A and 3B may have functions common to each other or may have functions different from each other. In the example illustrated in FIG. 1, the processing units 3A and 3B are arranged side by side in the horizontal direction along the direction indicated by arrow D1 (the left-right direction in FIG. 1).

[Details of Transfer Device]

Figure 2:
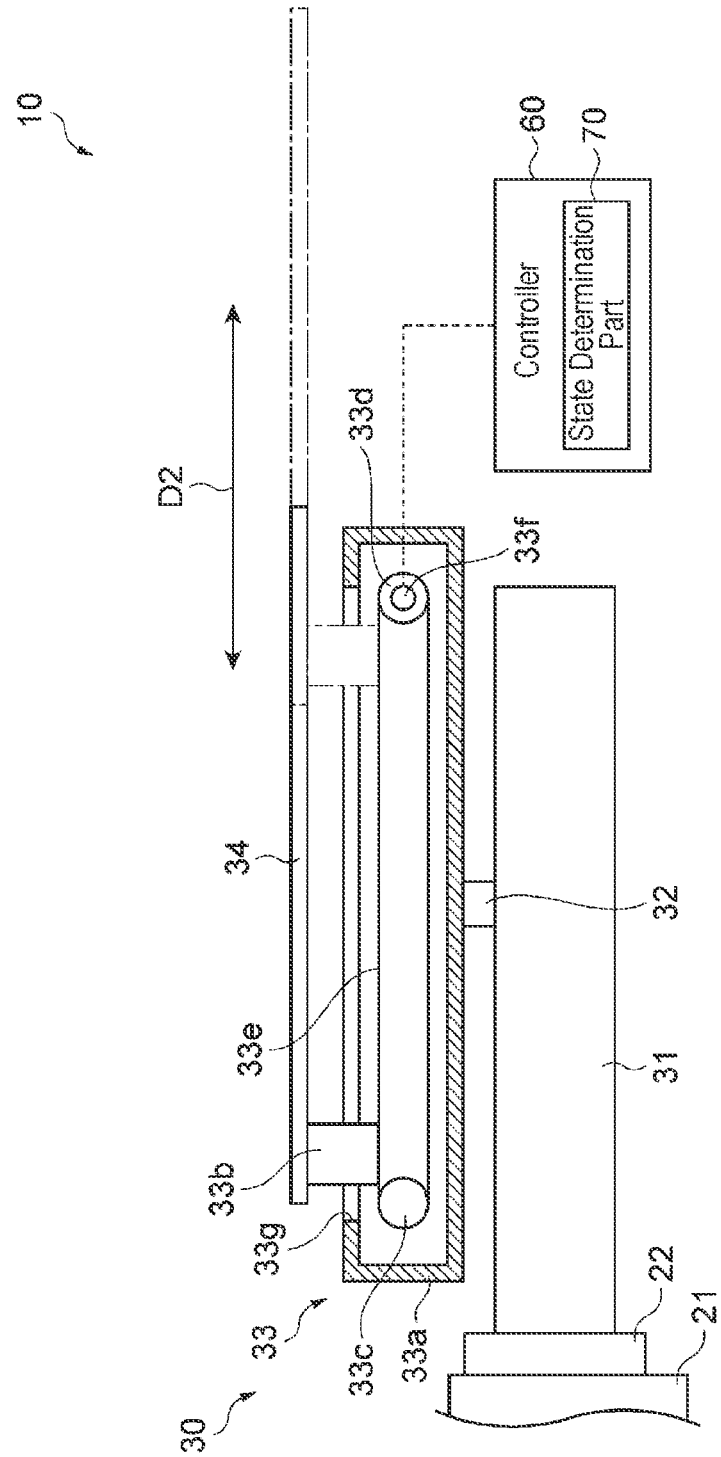
FIG. 2 is a side view schematically illustrating an example of a transfer device.

Next, the transfer device 10 will be described in more detail with reference to FIGS. 1 and 2. The transfer device 10 is configured to transfer the wafer W. The transfer device 10 may transfer the wafer W between, for example, the processing unit 3A and the processing unit 3B. The transfer device 10 may transfer the wafer W from another unit within the substrate processing apparatus 2 to the processing unit 3A or 3B, or may transfer the wafer W from the processing unit 3A or 3B to another unit. The transfer device 10 may be arranged to face the processing unit 3A or 3B. The transfer device 10 includes a driver 20 and a holder 30.

The driver 20 is configured to reciprocate the movement of the holder 30 in a predetermined direction. For example, as illustrated in FIG. 1, the driver 20 may reciprocate (operate) the movement of the holder 30 in the direction in which the processing unit 3A and the processing unit 3B are arranged (in the direction indicated by arrow D1). The driver 20 includes a housing 21, a linear movement body 22, a guide rail 23, pulleys 24 and 25, a belt 26, and a motor 27. The housing 21 accommodates respective elements included in the driver 20. An opening 21a is provided in the wall of the housing 21 facing the processing units 3A and 3B.

The linear movement body 22 is a member extending in the direction indicated by arrow D2 (the up-down direction in FIG. 1). The base end portion of the linear movement body 22 is connected to the guide rail 23 and the belt 26 within the housing 21. The tip of the linear movement body 22 protrudes outward of the housing 21 through the opening 21a. The guide rail 23 is installed within the housing 21 to extend linearly along the direction indicated by arrow D1 (the width direction of the housing 21). The pulleys 24 and 25 are arranged at respective ends of the housing 21 in the direction indicated by arrow D1, respectively. Each of the pulleys 24 and 25 is provided within the housing 21 to be rotatable around a rotation axis extending along the direction indicated arrow D2.

The belt 26 is stretched between the pulleys 24 and 25. The belt 26 may be, for example, a timing belt. The motor 27 is a power source that generates a rotation torque, and is configured to operate on the basis of a control signal from the controller 60. The motor 27 may be, for example, a servo motor. The motor 27 is connected to the pulley 25. When the torque (driving force) generated by the motor 27 is transmitted to the pulley 25, the belt 26 stretched between the pulleys 24 and 25 moves along the direction indicated by arrow D1. As a result, the movement of the linear movement body 22 is also reciprocated along the guide rail 23 in the direction indicated by arrow D1.

The holder 30 is configured to hold the wafer W to be transferred. For example, as illustrated in FIGS. 1 and 2, the holder 30 includes a base 31, a rotation shaft 32, a driver 33, and an arm 34 (a support member). The base 31 is installed on the tip of the linear movement body 22. Therefore, as the linear movement body 22 moves, the holder 30 is also capable of reciprocating the movement in the direction indicated by arrow D1.

The rotation shaft 32 extends upward from the base 31 along the vertical direction. The rotation shaft 32 is rotationally driven by a motor (not illustrated) configured to operate on the basis of a control signal from the controller 60. The driver 33 is connected to an upper portion of the rotation shaft 32. Therefore, when the rotation shaft 32 rotates, the driver 33 and the arm 34 rotate around the rotation shaft 32.

The driver 33 is configured to reciprocate the movement of the arm 34 in a direction different from the movement direction of the holder 30 by the driver 20. The driver 33 may reciprocate (operate) the movement of the arm 34, for example, in the direction indicated by arrow D2. When the driver 33 reciprocates the movement of the arm 34, the wafer W held by the arm 34 is carried in and out of the processing unit 3A or 3B. For example, as illustrated in FIG. 2, the driver 33 includes a housing 33a, a linear movement body 33b, pulleys 33c and 33d, a belt 33e, and a motor 33f. The housing 33a accommodates respective elements included in the driver 33. An opening 33g is provided in the upper wall of the housing 33a.

The linear movement body 33b is a member extending along the vertical direction. The lower end of the linear movement body 33b is connected to the belt 33e within the housing 33a. The upper end of the linear movement body 33b protrudes outward of the housing 33a through the opening 33g. The pulleys 33c and 33d are arranged at respective ends of the housing 33a in the direction indicated by arrow D2, respectively. Each of the pulleys 33c and 33d is provided within the housing 33a to be rotatable around a rotation axis extending along the direction indicated arrow D1.

The belt 33e is stretched between the pulleys 33c and 33d. The belt 33e may be, for example, a timing belt. The motor 33f is a power source that generates a rotation torque, and is configured to operate based on a control signal from the controller 60. The motor 33f may be, for example, a servo motor. When the torque (driving force) generated by the motor 33f is transmitted to the pulley 33d, the belt 33e stretched between the pulleys 33c and 33d moves along the direction indicated by arrow D2. As a result, the movement of the linear movement body 33b is also reciprocated in the direction indicated by arrow D2.

The arm 34 is configured to surround the peripheral edge of the wafer W and support the rear surface of the wafer W. The arm 34 is installed at the tip of the linear movement body 33b. Therefore, as the linear movement body 33b moves, the movement of the arm 34 is also capable of reciprocating in the direction indicated by arrow D2. The holder 30 may include a plurality of arms 34 arranged to be stacked along the vertical direction.

[Controller]

Figure 3:
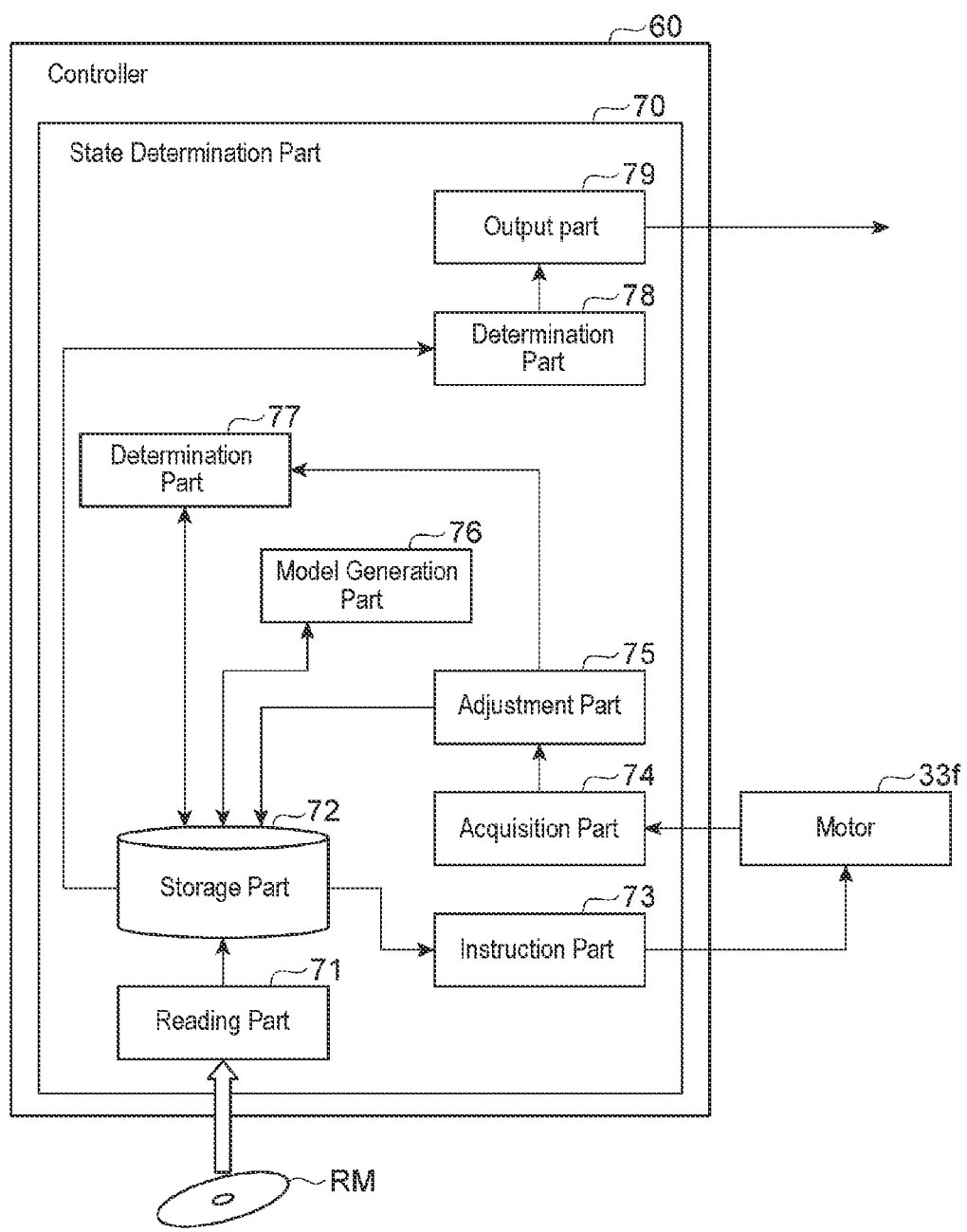
FIG. 3 is a block diagram illustrating an example of a functional configuration of a controller.
Figure 4:
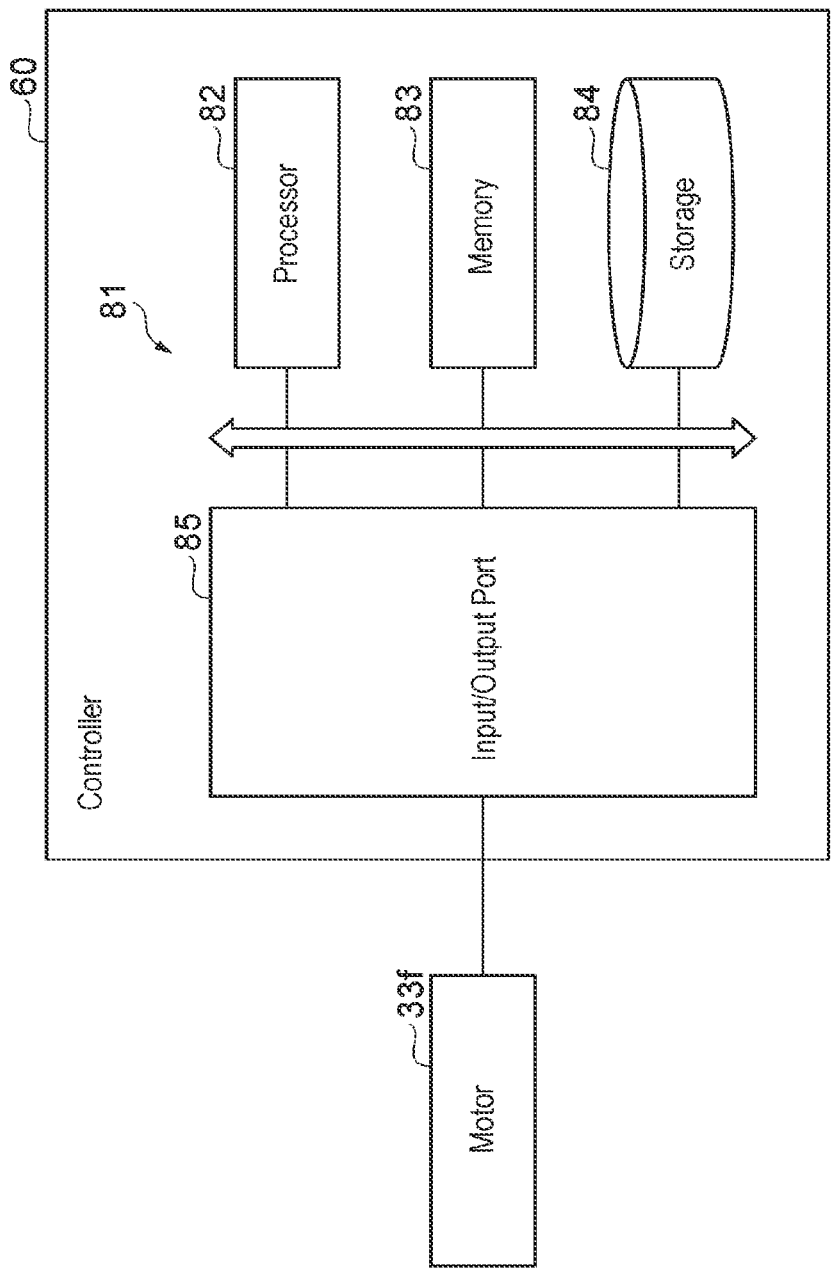
FIG. 4 is a block diagram illustrating an example of a hardware configuration of the controller.

Next, the controller 60 will be described in more detail with reference to FIGS. 3 and 4. The controller 60 controls the substrate processing apparatus 2 partially or entirely. As illustrated in FIG. 3, the controller 60 includes a state determination part 70 (a state determination device). The state determination part 70 determines the state of the transfer device 10 that operates while holding the wafer W. Hereinafter, a description will be made of an example in which the state determination part 70 determines the state of the driver 33 (e.g., the suitability of the tension of the belt 33e).

As functional modules, the state determination part 70 includes, for example, a reading part 71, a storage part 72, an instruction part 73, an acquisition part 74, an adjustment part 75, a model generation part 76, a determination part 77 (a first determination part), a determination part 78 (a second determination part), and an output part 79. These functional modules merely correspond to the functions of the controller 60 divided into a plurality of modules for the sake of convenience in description, which does not necessarily mean that the hardware constituting the controller 60 is divided into such modules. Each functional module is not limited to one implemented by executing a program, and may be implemented by a dedicated electric circuit (e.g., a logic circuit) or an integrated circuit in which the electric circuit is integrated (application-specific integrated circuit (ASIC)).

The reading part 71 has a function of reading a program from a computer-readable recording medium RM. The recording medium RM records a program for operating each part in the transfer device 10 accompanying the transfer of the wafer W and a program for determining the state of the transfer device 10 by the state determination part 70. The recording medium RM may be, for example, a semiconductor memory, an optical recording disk, a magnetic recording disk, or a magneto-optical recording disk.

The storage part 72 has a function of storing various data. The storage part 72 stores, for example, a program read from the recording medium RM by the reading part 71, various data for determining the state of the transfer device 10, a determination result on the state of the transfer device 10, and the like.

The instruction part 73 has a function of transmitting a control signal on the basis of a program for operating each part in the transfer device 10 stored in the storage part 72. Specifically, the instruction part 73 drives the motor 33$f$ of the driver 33 to generate a control signal for moving the arm 34 along the direction indicated by arrow D2. The instruction part 73 drives the motor 27 of the driver 20 to generate a control signal for moving the arm 34 along the direction indicated by arrow D1.

The acquisition part 74 has a function of acquiring operation data of the transfer device 10. The acquisition part 74 may acquire, for example, a torque signal of the motor 33$f$ as operation data. The acquisition part 74 may acquire a torque signal for each operation of the arm 34. The torque signal may be time-series data obtained in a predetermined sampling cycle from the time change of the torque of the motor 33$f$ (an analog signal). One operation of the arm 34 may be, for example, the unidirectional movement of the arm 34 performed in the direction indicated by D2 by driving the motor 33$f$. For example, the acquisition part 74 may acquire about 100 to 200 discrete values per operation of the arm 34 from the time change of the torque. The acquisition part 74 outputs the acquired torque signal to the adjustment part 75.

The adjustment part 75 has a function of adjusting the number of data pieces of operation data (torque signals) acquired by the acquisition part 74 to a predetermined number. The operation time in one operation of the arm 34 may vary slightly in another operation even if the other operation is the same as the one operation. Therefore, when the acquisition part 74 obtains discrete values of torque signals in a predetermined sampling cycle, the number of data pieces may vary for each operation of the arm 34. The adjustment part 75 adjusts the number of data pieces of torque signal, which varies for each operation of the arm 34, to a predetermined number. For example, the adjustment part 75 may perform a discrete Fourier transform (DFT) on a torque signal to acquire frequency data, and may perform an inverse discrete Fourier transform (IDFT) on the frequency data such that the number of data pieces after the transform becomes a predetermined number (e.g., 128).

By adjusting the number of data pieces of the torque signal, for example, a torque signal having a compressed number of data pieces may be generated. That is, the operation data having the number of data pieces larger than a predetermined number may be adjusted to the operation data compressed to a predetermined number of data pieces (compressed operation data). The adjustment part 75 outputs the operation data having an adjusted number of data pieces to the storage part 72 and the determination part 77. The adjustment part 75 may adjust the number of data pieces of the operation data through another method. For example, when the number of data pieces of the operation data exceeds 128, the adjustment part 75 may exclude the 129th and subsequent data pieces. Instead of compressing the number of data pieces, the adjustment part 75 may adjust the number of data pieces such that the number of data pieces increases with respect to the number of data pieces of the torque signal before adjustment. Next, a case of compressing the number of data pieces will be described as an example.

The model generation part 76 has a function of generating a monitoring model for the transfer device 10. When the target for state determination by the state determination part 70 is the driver 33, the model generation part 76 generates the monitoring model by executing machine learning using an auto-encoder on the basis of normal operation data derived from operation data (a torque signal) acquired by the acquisition part 74 at the time of normal operation of the driver 33. When the monitoring model is generated, the model generation part 76 outputs the monitoring model to the storage part 72. The normal operation is an operation of the driver 33 in the state in which it has been determined that deterioration, abnormality, or the like has not occurred in the driver 33. The normal operation data may be operation data in which the number of data pieces has been compressed by the adjustment part 75 (compressed operation data), or may be operation data acquired by the acquisition part 74. Details of the monitoring model generation method will be described later.

The determination part 77 has a function of determining the state of the transfer device 10. The determination part 77 determines the state of the drive mechanism on the basis of output data (first output data) obtained by inputting, to the monitoring model, evaluation data derived from the operation data acquired by the acquisition part 74 at the time of evaluation of the transfer device 10. The time of evaluation is, for example, the time at which the wafer W is continuously processed in the substrate processing apparatus 2 in the state in which an operator or the like cannot determine the state of the transfer device 10. The evaluation data may be operation data in which the number of data pieces has been compressed by the adjustment part 75 (compressed operation data), or may be operation data acquired by the acquisition part 74. The determination method by the determination part 77 will be described later. The determination part 77 outputs determination results to the storage part 72.

The determination part 78 has a function of determining the degree to which the transfer device 10 is approaching an abnormal state on the basis of the determination results by the determination part 77 accumulated in the storage part 72 for a predetermined period. The determination method by the determination part 78 will be described later. The determination part 78 outputs the determination results to the output part 79.

The output part 79 has a function of outputting the determination results by the determination part 78. For example, the output part 79 may output a signal indicating the determination results to other elements in the controller 60, or may output a signal indicating the determination results to the outside of the controller 60. The output part 79 may output a signal indicating that the transfer device 10 is approaching an abnormal state as a signal indicating the determination results (hereinafter, referred to as an "alarm signal"). When the alarm signal is output, the controller 60 may temporarily stop the transfer operation by the transfer device 10, or may temporarily stop the processing of the wafer W in the substrate processing apparatus 2. Alternatively, the substrate processing apparatus 2 may further include a notification part (not illustrated). When receiving an alarm signal from the output part 79, the notification part notifies the operator or the like that the transfer device 10 is approaching an abnormal state.

The hardware of the controller 60 is configured with, for example, one or more control computers. The controller 60 has, for example, a circuit 81 illustrated in FIG. 4 as a hardware configuration. The circuit 81 may be constituted with an electric circuit element (circuitry). Specifically, the circuit 81 includes a processor 82, a memory 83 (a storage part), a storage 84 (a storage part), and an input/output port 85. The processor 82 constitutes each of the above-mentioned functional modules by executing a program in cooperation with at least one of the memory 83 and the storage 84 and executing input/output of a signal via the input/output port 85. Via the input/output port 85, input/output of signals is performed between the processor 82, the memory 83, and the storage 84, and various apparatuses (the transfer device 10) of the substrate processing apparatus 2.

In the present embodiment, the substrate processing system 1 includes one controller 60, but may include a controller group (a control part) including a plurality of controllers 60. When the substrate processing system 1 includes the controller group, each of the above-mentioned functional modules may be implemented by one controller 60, or may be implemented by a combination of two or more controllers 60. When the controller 60 includes a plurality of computers (the circuit 81), each of the above functional modules may be implemented by one computer (the circuit 81), or a combination of two or more computers (the circuit 81). The controller 60 may include a plurality of processors 82. In this case, each of the above-mentioned functional modules may be implemented by one or more processors 82.

[State Determination Method]

Next, a method of determining the state of the transfer device 10 will be described with reference to FIG. 5.

Figure 5:
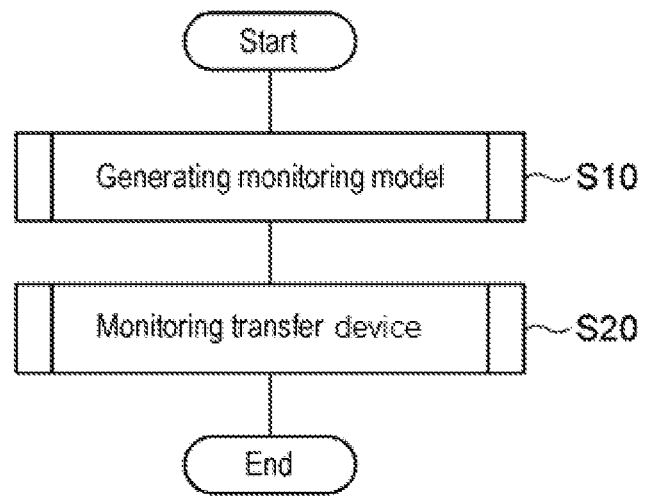
FIG. 5 is a flowchart illustrating an example of a state determination procedure of the transfer device.

First, the controller 60 generates a monitoring model for the driver 33 on the basis of the operation data at the time of normal operation of the driver 33 (step S10 in FIG. 5). Subsequently, the controller 60 monitors the state of the driver 33 on the basis of the operation data at the time of evaluation of the driver 33 using the generated monitoring model (step S20 in FIG. 5). The controller 60 may repeatedly execute the process of step S20. The stage in which the process in step S10 is performed is referred to as a "learning stage", and the stage in which the process in step S20 is continued is referred to as a "monitoring (evaluation) stage".

[Monitoring Model Generation Method]

Next, the method of generating the monitoring model in step S10 will be described in more detail with reference to FIGS. 6 to 12. The generation of the monitoring model may be performed, for example, when no wafer W is processed by the substrate processing apparatus 2. In addition, the monitoring model may be generated when the operator determines that the state of the driver 33 is normal.

Figure 6:
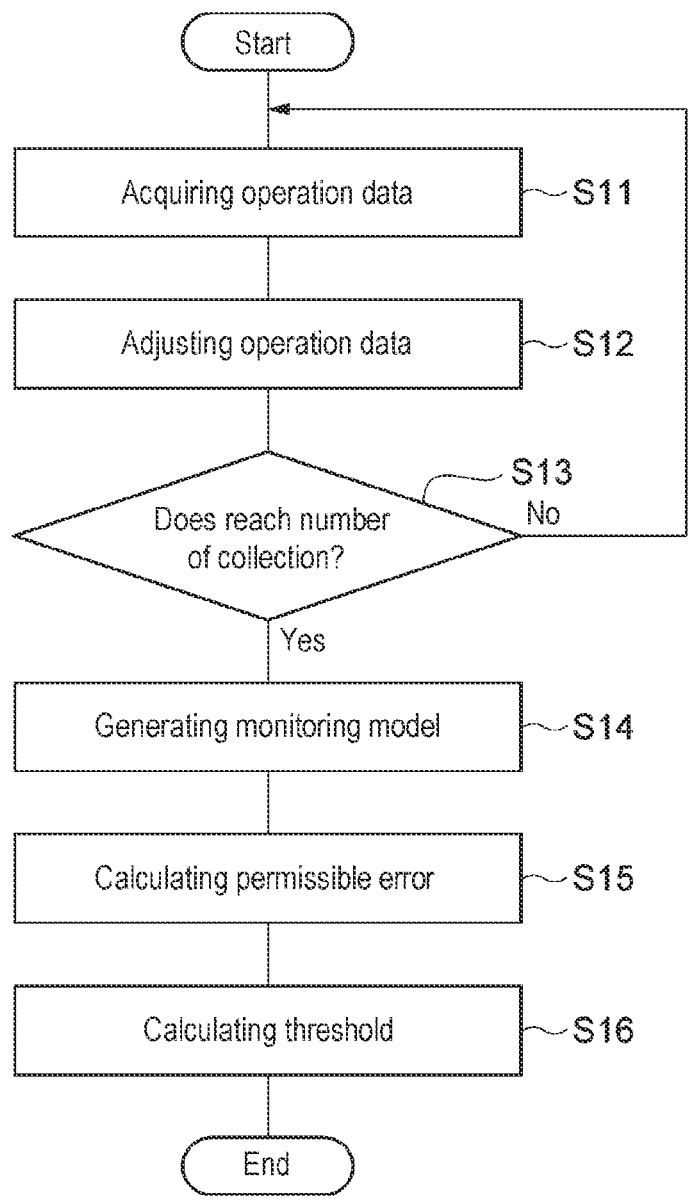
FIG. 6 is a flowchart illustrating an example of a monitoring model generation procedure.
Figure 7:
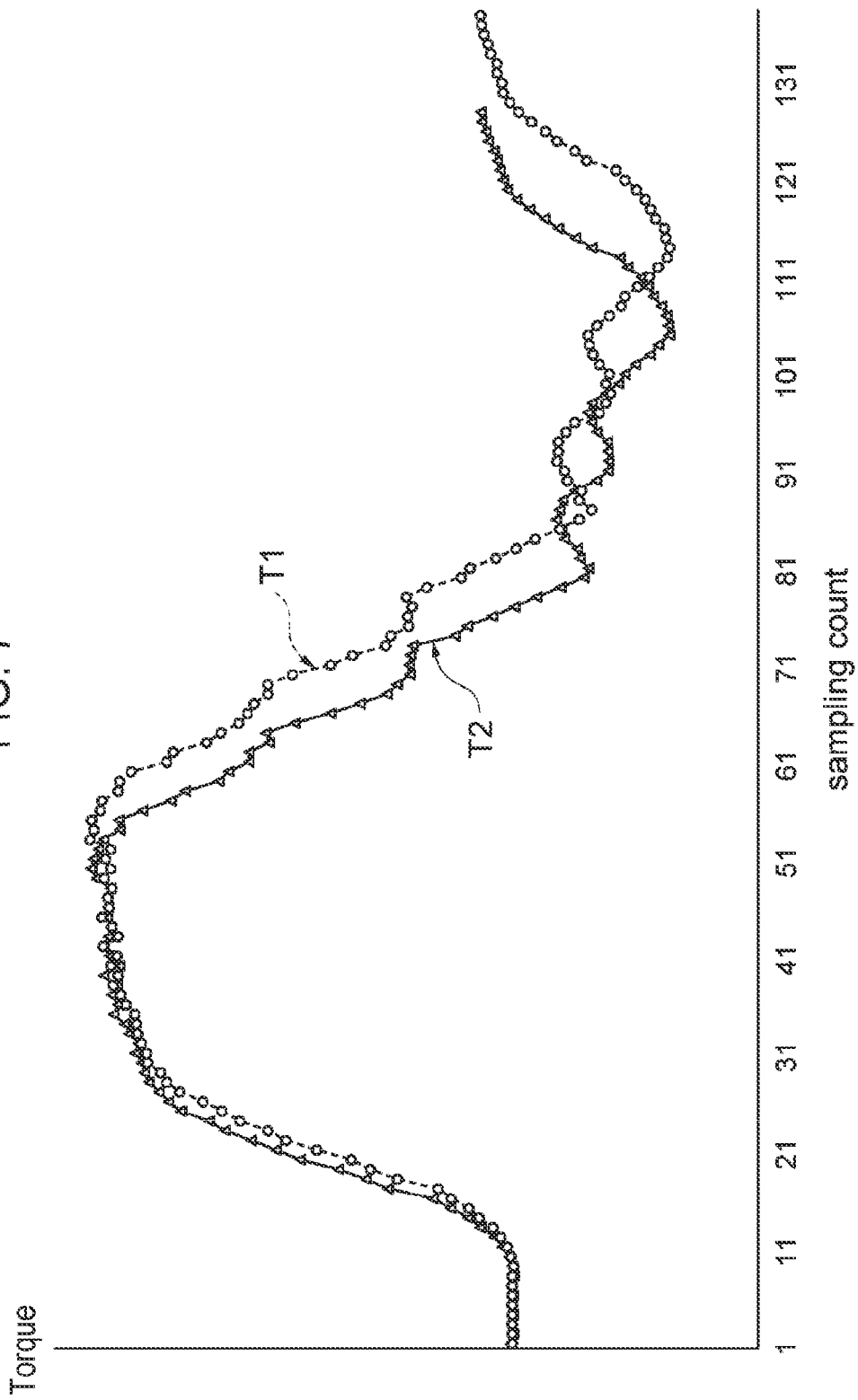
FIG. 7 is a view for explaining an adjustment of acquired data by an adjustment part.

First, the state determination part 70 acquires operation data at the time of normal operation of the driver 33 (step S11 in FIG. 6). In step S11, first, the instruction part 73 controls the motor 33f to cause the arm 34 to perform one operation in the direction indicated by arrow D2. Subsequently, the acquisition part 74 acquires, as operation data, a torque signal obtained by sampling the time change of the torque in the operation in a predetermined sampling cycle. The acquisition part 74 may acquire, as operation data, a torque signal obtained in response to a current command value to the motor 33f by the instruction part 73, or may acquire, as operation data, a torque signal obtained according to the detection result of a torque sensor provided in the motor 33f. In FIG. 7, an example of the operation data obtained by the acquisition part 74 is illustrated as operation data T1. In this example, the number of data pieces of the operation data T1 is 136. That is, the operation data T1 is represented by 136 discrete values. The acquisition part 74 outputs the acquired operation data to the adjustment part 75.

Subsequently, the state determination part 70 adjusts the operation data acquired by the acquisition part 74 (step S12 in FIG. 6). In step S12, the adjustment part 75 adjusts the number of data pieces of the operation data to a predetermined number. The adjustment part 75 may generate compressed operation data by, for example, performing a discrete Fourier transform and an inverse discrete Fourier transform on the operation data. In FIG. 7, an example of the compressed operation data generated by the adjustment part 75 is illustrated as compressed operation data T2. In this example, the compressed operation data T2 is generated by adjusting (compressing) the number of data pieces of the operation data T1 from 136 to 128. The sampling count on the horizontal axis corresponds to time, and as shown in FIG. 7, the compressed operation data T2 has a waveform obtained by compressing the operation data T1 on the time axis (in the horizontal direction on the paper surface). The adjustment part 75 outputs the generated compressed operation data to the storage part 72. The compressed operation data obtained at the time of normal operation is used as learning data (normal operation data) when generating the monitoring model.

Subsequently, the state determination part 70 determines whether or not the number of data pieces of the normal operation data generated by the adjustment part 75 has reached a predetermined number (hereinafter, referred to as a "collected number") (step S13 in FIG. 6). When it is determined that the number of data pieces of the normal operation data has not reached the collected number (step S13: "NO"), the state determination part 70 repeats steps S11 and S12. At this time, the state determination part 70 causes the driver 33 to repeatedly perform the same operation, and acquires a plurality of pieces of normal operation data. For example, the state determination part 70 causes the driver 33 to repeatedly perform an operation when the wafer W is carried into the processing unit 3A (or the processing unit 3B) or an operation when the wafer W is carried out from the processing unit 3A.

As a result, a plurality of (for example, 600 to 1,800) pieces of normal operation data are stored in the storage part 72 as a learning data group. In a case in which the tension (frequency) of the belt 33e is set to different values, the state determination part 70 may store a learning data group for each case in the storage part 72. For example, the learning data group may include 200 to 600 pieces of normal operation data acquired when the frequency corresponding to the tension is 140 Hz, 200 to 600 pieces of normal operation data acquired when the frequency is 130 Hz, and 200 to 600 pieces of normal operation data acquired when the frequency is 120 Hz.

When it is determined that the number of pieces of normal operation data included in the learning data group has reached the collected number (step S13: "YES"), the state determination part 70 generates a monitoring model AE (see FIG. 8) on the basis of the accumulated learning data group (step S14 in FIG. 6). This monitoring model AE is a model based on the characteristics of the driver 33, and is used to determine the state of the driver 33. In step S14, the model generation part 76 generates a monitoring model for a specific operation of the driver 33 by performing machine learning on the basis of a plurality of pieces of normal operation data in the learning data group.

The model generation part 76 generates a monitoring model AE on the basis of a plurality of normal torque signals included in the learning data group through machine learning using an auto-encoder, which is a kind of neural network. Through the machine learning using the auto-encoder, a model is generated which has an intermediate layer in which, for input data having a predetermined number of data pieces, output data having the same number of data pieces as the input data outputs the same value as the input data. The intermediate layer of this model includes a plurality of layers in which characteristic amounts are sequentially compressed and restored in order from the input data. When the number of data pieces adjusted by the adjustment part 75 is, for example, 128, a monitoring model AE in which 128 pieces of data are input and 128 pieces of output data are obtained is generated. The model generation part 76 outputs the generated monitoring model AE to the storage part 72.

Figure 8:
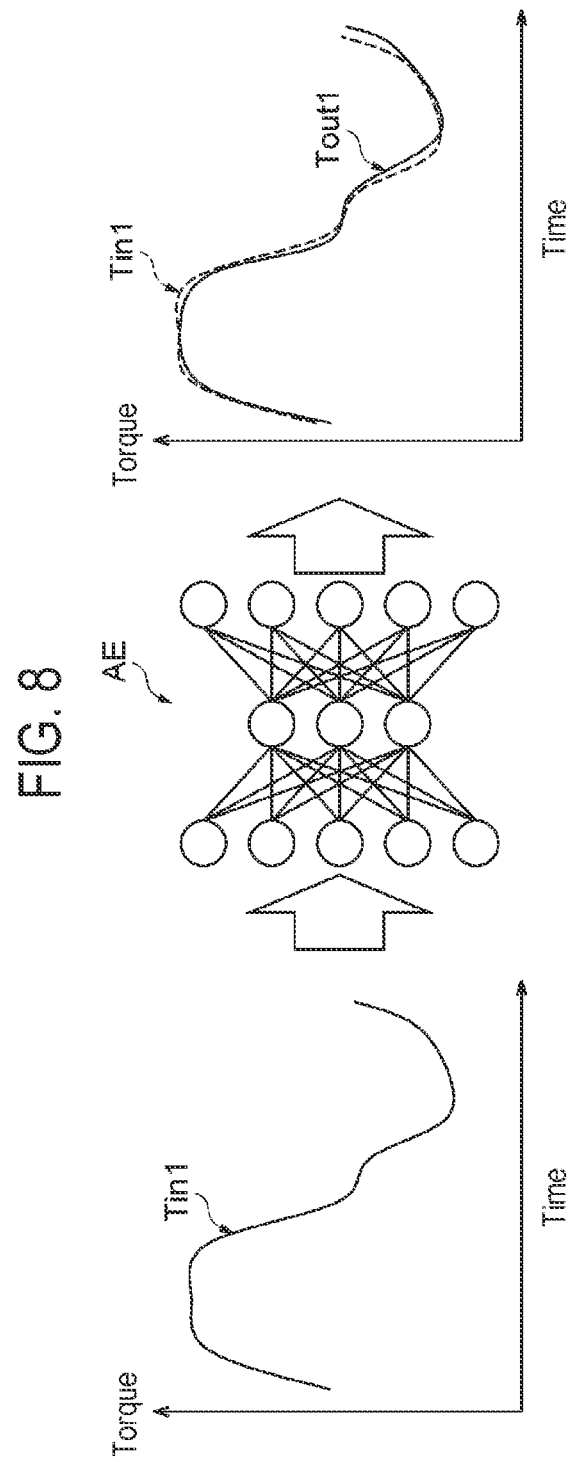
FIG. 8 is a view for explaining a monitoring model generated by a machine learning.
Figure 9:
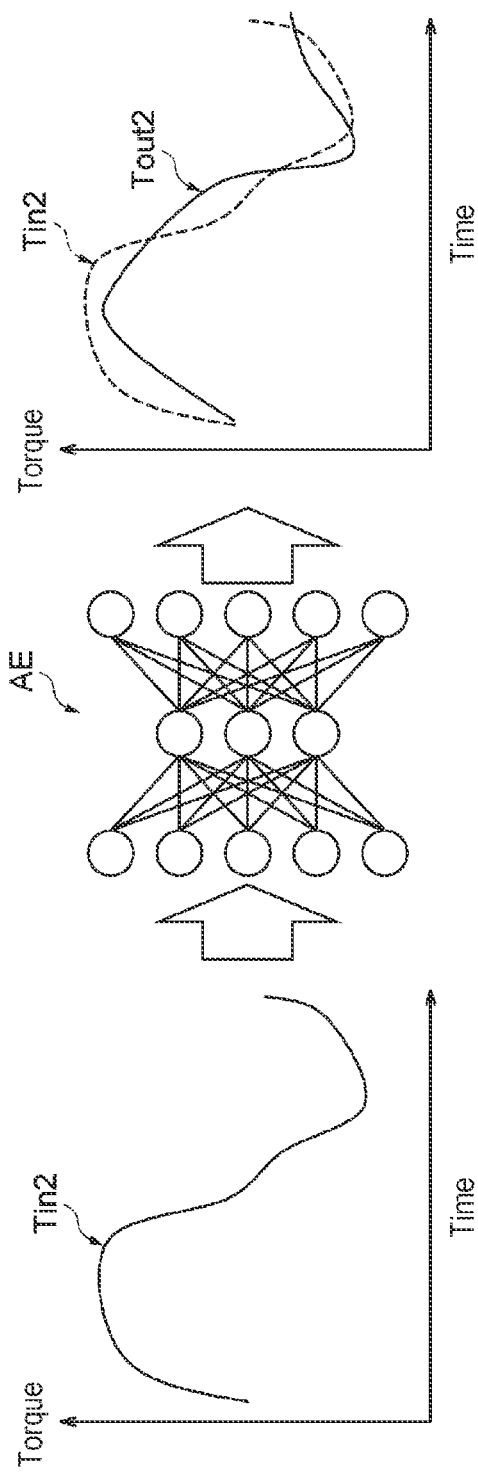
FIG. 9 is a diagram for explaining a monitoring model generated by a machine learning.

FIG. 8 illustrates an example of output data obtained when normal operation data Tin1 is input to the monitoring model AE. Since the monitoring model AE is generated on the basis of the normal operation data, when the normal operation data Tin1 is input to the monitoring model AE, output data Tout1 close to the waveform of the normal operation data Tin1 is output from the monitoring model AE. Meanwhile, FIG. 9 illustrates an example of output data obtained when compressed operation data Tin2 is input to the monitoring model AE in a case in which the driver 33 is not in the normal state. In this case, output data Tout2 greatly deviated from the waveform of the compressed operation data Tin2 is output from the monitoring model AE. That is, the state of the driver 33 can be determined using the fact that, for input data to the monitoring model AE, the error (deviation) of output data from the monitoring model AE becomes large when the driver 33 is approaching an abnormality.

Subsequently, the state determination part 70 (the determination part 78) calculates a permissible error Ea in the monitoring model AE (step S15 in FIG. 6). Here, the monitoring model AE is generated on the basis of the normal operation data, but even when the same normal operation data is input again, output data that completely matches the input data is not output. That is, even when the normal operation data is the input data, an error (deviation) due to the monitoring model AE itself may occur between the input data and the output data. Therefore, in the present embodiment, the state determination part 70 calculates the error caused by the monitoring model AE itself as the permissible error Ea. In step S15, first, the model generation part 76 inputs each of the plurality of data pieces of normal operation data included in the learning data group into the monitoring model AE, and calculates a difference between the input data and the output data (second output data) as an error Eb (a first error).

Figure 10:
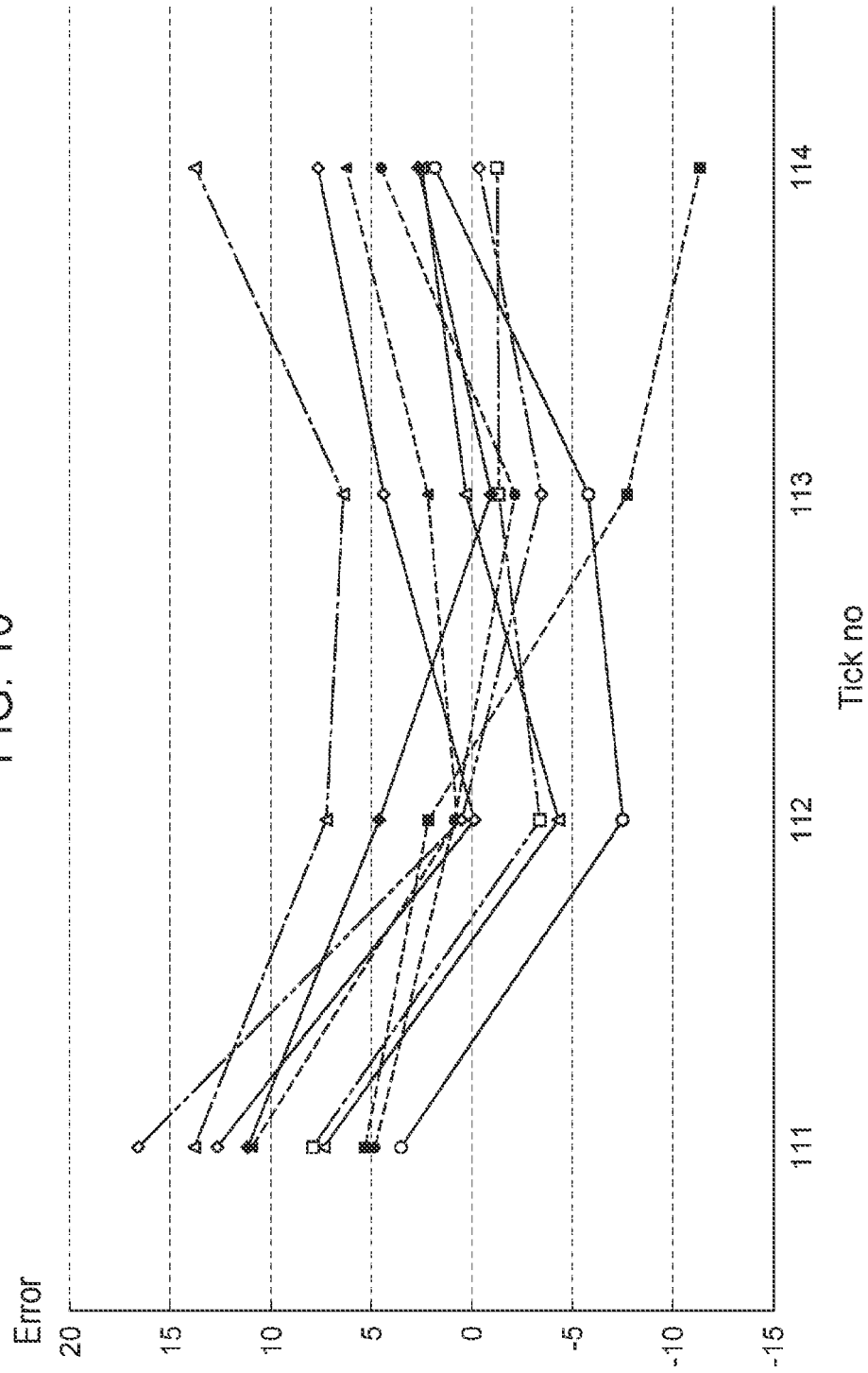
FIG. 10 is a graph for explaining a permissible error included in a monitoring model.

FIG. 10 illustrates an example of calculation results of errors Eb. In FIG. 10, as an example, in a case in which 10 pieces of normal operation data are input to the monitoring model AE, calculation results of errors Eb when "Tick no" is 111 to 114 are shown as an example. Here, "Tick no" corresponds to sampling count values shown in FIG. 7, and for example, when "Tick no" is 111, it indicates the $111^{th}$ data piece. Hereinafter, the data when "Tick no" is 1 to 128 will be referred to as "$1^{st}$ to $128^{th}$ data pieces", respectively.

The determination part 78 may calculate errors Eb for the $1^{st}$ to $128^{th}$ data pieces in each of all or part of normal operation data pieces included in the learning data group. The model generation part 76 may calculate permissible errors Ea due to a monitoring model AE itself on the basis of the errors Eb. The model generation part 76 may set a range of $\mu1 \pm 3\sigma1$ as the permissible error Ea when the parameters $\mu1$ and $\sigma1$ are assumed to be the average value of the errors Eb and the standard deviation of the errors Eb, respectively. The determination part 78 stores the calculated permissible errors Ea in the storage part 72.

Subsequently, the controller 60 calculates a threshold Th1 of a degree of deviation (a first degree of deviation) (step S16 in FIG. 6). The degree of deviation da is an index indicating the degree to which the driver 33 is approaching an abnormal state at the time of evaluation. The threshold Th1 indicates that a target drive mechanism is approaching an abnormal state. Here, after explaining a method of calculating a degree of deviation, a specific example of a method of calculating the threshold Th1 of the degree of deviation da will be described.

In step S16, the determination part 77 calculates a difference between an error Eb and a permissible error Ea as a correction error Ec per $1^{st}$ to $128^{th}$ data pieces in a plurality of respective normal operation data pieces. The determination part 77 may calculate the correction error Ec as 0 when the value of the error Eb is included in the range of the permissible errors Ea. When the value of the error Eb is outside the range of permissible errors Ea, the determination part 77 may calculate the difference between the upper limit value or the lower limit value of the permissible errors Ea and the value of the error Eb as a correction error Ec.

Figure 11A:
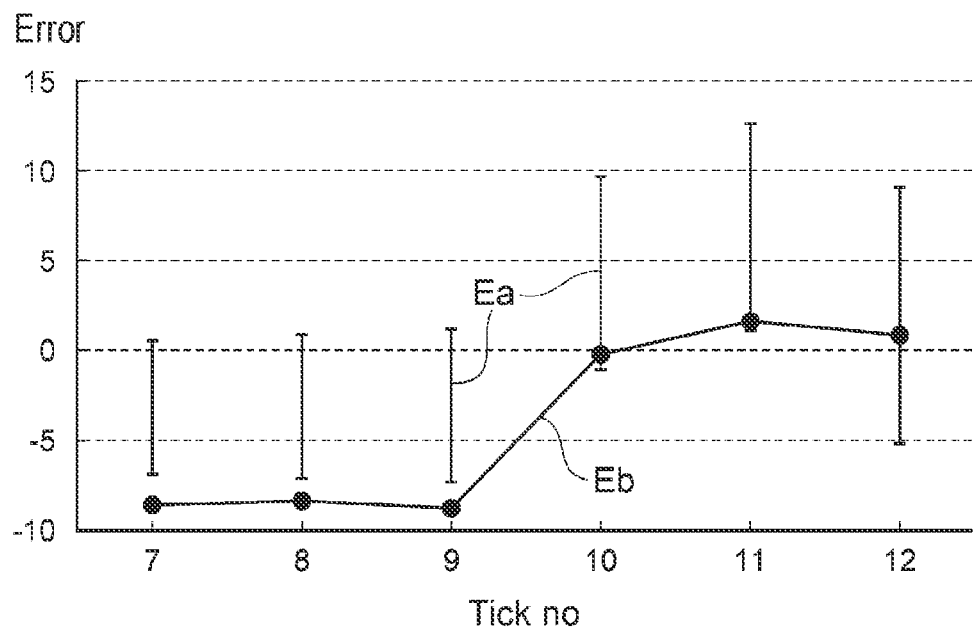
FIGS. 11A and 11B are views for explaining a degree of deviation between a permissible error and an output value.
Figure 11B:
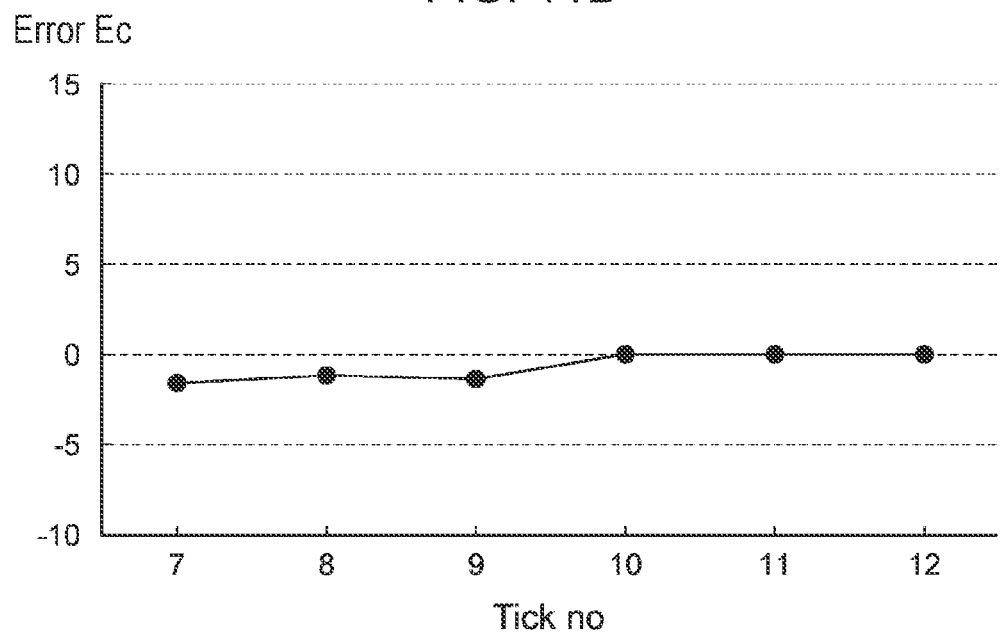

FIG. 11A shows an example of the calculation result on errors Eb and permissible errors Ea. In FIG. 11A, the values of errors Eb are indicated by black circles, and the ranges of permissible errors Ea are indicated by vertical solid lines. In the example illustrated in FIG. 11A, the errors Eb are out of the ranges of permissible errors Ea in $7^{th}$ to $9^{th}$ data pieces, and the errors Eb are within the ranges of the permissible errors Ea in $10^{th}$ to $12^{th}$ data pieces. FIG. 11B illustrates, as an example, the calculation result on differences (correction errors Ec) between the errors Eb and the permissible errors Ea shown in FIG. 11A. In the $7^{th}$ to $9^{th}$ data pieces, the correction errors Ec are not 0 because the errors Eb are outside the ranges of the permissible errors Ea, respectively. Meanwhile, in the $10^{th}$ to $12^{th}$ data pieces, the correction errors Ec are 0 because the errors Eb are within the ranges of the permissible errors Ea, respectively.

The determination part 77 performs a process of calculating a degree of deviation dr (a second degree of deviation) for learning on the basis of a corrected error Ec of each of $1^{st}$ to $128^{th}$ data pieces for a plurality of pieces of normal operation data. The determination part 77 may perform a process of calculating, for example, a value, which is obtained by calculating a root mean squared error (RMSE) of the correction errors Ec (differences between errors Eb and permissible errors Ea) for the $1^{st}$ to $128^{th}$ data pieces), as a degree of deviation for learning dr for a plurality of pieces of normal operation data. The root mean squared error based on the errors Eb and the permissible errors Ea is obtained by calculating, for each piece of the normal operation data, the square root of a mean value obtained by averaging the squared values of the correction errors Ec of each of the $1^{st}$ to $128^{th}$ data pieces.

Figure 12:
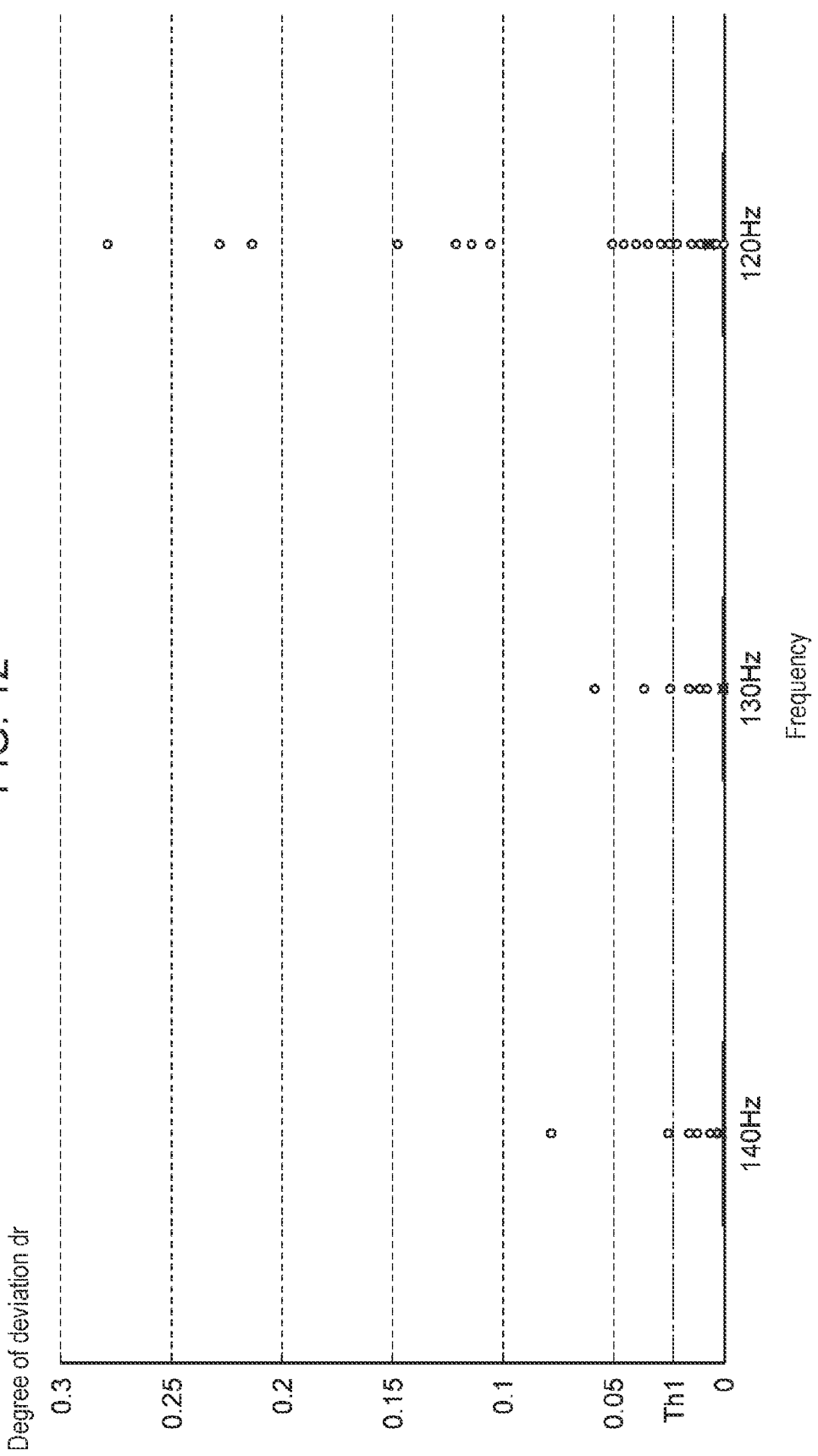
FIG. 12 is a graph for explaining a method of setting a threshold of a degree of deviation.

FIG. 12 shows an example of the calculation result on degrees of deviation dr for a learning data group. In FIG. 12, the calculation results on degrees of deviation dr for learning are shown as a "box-and-whisker graph". In FIG. 12, since the calculation results on degrees of deviation dr based on a learning data group are shown, boxes each indicating an interquartile range are drawn in the vicinity of the degree of deviation dr of 0, and thus the boxes are invisible. Regarding the threshold Th1 of the degree of deviation da used at the time of evaluation, the determination part 77 may calculate the threshold Th1 as Th1=$3\sigma_2$ when the parameter 62 is the standard deviation of degrees of deviation dr for learning from the permissible errors Ea, which is obtained on the basis of comparison between the errors Eb and the permissible errors Ea. The determination part 77 outputs the threshold value Th1 to the storage part 72.

[Method of Monitoring State of Transfer Device]

Subsequently, with reference to FIG. 13, a method of monitoring the state of the driver 33 in step S20 illustrated in FIG. 5 will be described in more detail. The state monitoring of the driver 33 may be continuously performed, for example, when the wafer W is being processed by the substrate processing apparatus 2.

Figure 13:
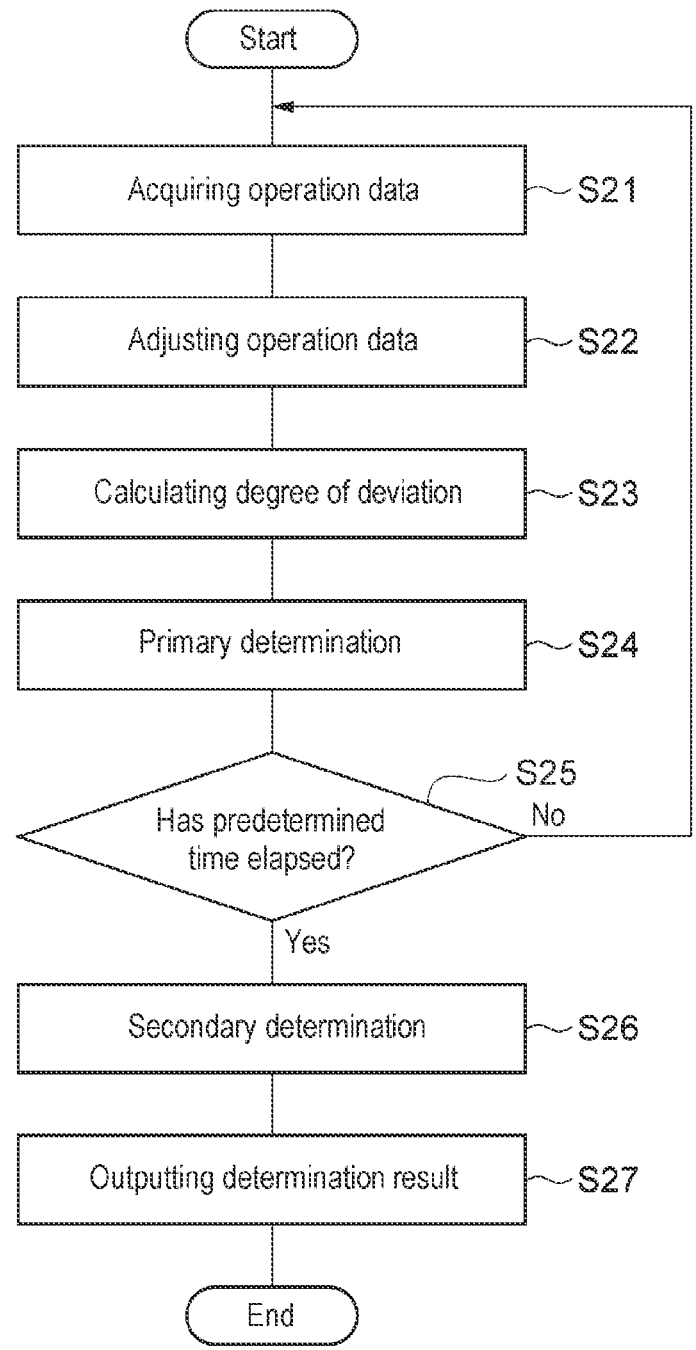
FIG. 13 is a flowchart showing an example of a procedure of monitoring the transfer device.

First, the state determination part 70 acquires operation data at the time of evaluation of the driver 33 (step S21 in FIG. 13). In step S21, the instruction part 73 causes the arm 34 to perform one operation along the direction indicated by arrow D2 by controlling the motor 33f in accordance with the processing of the wafer W in the substrate processing apparatus 2. Subsequently, the acquisition part 74 acquires, as operation data, a torque signal (evaluation torque signal) obtained by sampling a time change of torque in the operation in a predetermined sampling cycle. This step S21 is performed in the same manner as step S11, except that it is unclear whether or not the state of the driver 33 is normal. The acquisition part 74 outputs the acquired operation data to the adjustment part 75.

Subsequently, the state determination part 70 adjusts the operation data acquired by the acquisition part 74 (step S22 in FIG. 13). In step S22, the adjustment part 75 generates compressed operation data by adjusting the number of data pieces of the operation data to a predetermined number (e.g., 128), as in step S12. The adjustment part 75 outputs the generated compressed operation data to the determination part 77. The compressed operation data obtained at the time of evaluation is used as evaluation data for determining the state of the driver 33.

Subsequently, the state determination part 70 calculates a degree of deviation da on the basis of the evaluation data generated by the adjustment part 75 (step S23 in FIG. 13). In step S23, the determination part 77 calculates the degree of deviation da on the basis of the monitoring model AE stored in the storage part 72. First, the determination part 77 may calculate, for example, errors Ed (second errors) between the output data obtained by inputting the evaluation data into the monitoring model AE and the input evaluation data. Then, the determination part 77 calculates the degree of deviation da by comparing the errors Ed with permissible errors Ea of the monitoring model AE. This degree of deviation da may be obtained by calculating the root mean squared error based on the errors Ed and the permissible errors Ea (by comparison between the errors Ed and the permissible errors Ea), as in the calculation of the deviation of degree dr in step S16. The root mean squared error based on the errors Ed and the permissible errors Ea is obtained by calculating, for each evaluation data piece, the square root of an average value obtained by averaging the squared values of the differences between the errors Ed and the permissible errors Ea of each of $1^{st}$ to $128^{th}$ data pieces.

Subsequently, the state determination part 70 performs a primary determination to determine the state of a target drive mechanism on the basis of the calculated degree of deviation da (step S24 in FIG. 13). In step S24, the determination part 77 may determine the state of the target drive mechanism on the basis of whether or not the degree of deviation da exceeds the threshold Th1 stored in the storage part 72. The determination part 77 may output the determination result on whether or not the degree of deviation da exceeds the threshold Th1 to the storage part 72.

Subsequently, the state determination part 70 determines whether or not a predetermined period of time has elapsed from the start of monitoring of the driver 33 (step S25 in FIG. 13). When it is determined that the predetermined period of time has not elapsed (step S25: "NO"), the state determination part 70 repeats steps S21 to S25. As a result, the storage part 72 stores a data group (hereinafter referred to as a "determination data group") in which the determination results on the state of the driver 33 on the basis of the degree of deviation da are accumulated for the predetermined period of time. The storage part 72 may store the predetermined period of time, and the predetermined period may be preset by, for example, an operator. As the predetermined period of time, for example, one hour, several hours, half a day, one day, one week, or the like may be set.

When it is determined that the predetermined period of time has elapsed (step S25: "YES"), the state determination part 70 performs a secondary determination on the basis of the determination data group to determine the degree to which the driver 33 is approaching an abnormal state (step S26 in FIG. 13). In step S26, for example, the determination part 78 may determine the degree to which the driver 33 is approaching an abnormal state on the basis of the ratio of data in which the degree of deviation da exceeds the threshold Th1 in the determination data group (hereinafter, referred to as a "data ratio"). The data ratio is a ratio of the number of determination results determined to exceed the threshold Th1 to the total number of determinations made by the determination part 77 in the predetermined period of time.

The determination part 78 may determine that the target drive mechanism is approaching an abnormal state when the data ratio exceeds a predetermined threshold Th2. The threshold Th2 may be set to an arbitrary value by an operator or the like, may be set within the range of 70% to 100%, may be set within the range of 80% to 100%, or may be set in the range of 90% to 100%. The determination part 78 outputs the determination results to the output part 79.

Subsequently, the state determination part 70 outputs the determination results (step S27 in FIG. 13). In step S27, the output part 79 may output, for example, a signal (alarm signal) indicating that the target drive mechanism is approaching an abnormal state as a signal (an alarm signal) indicating the determination results.

[Verification Result]

Figure 14:
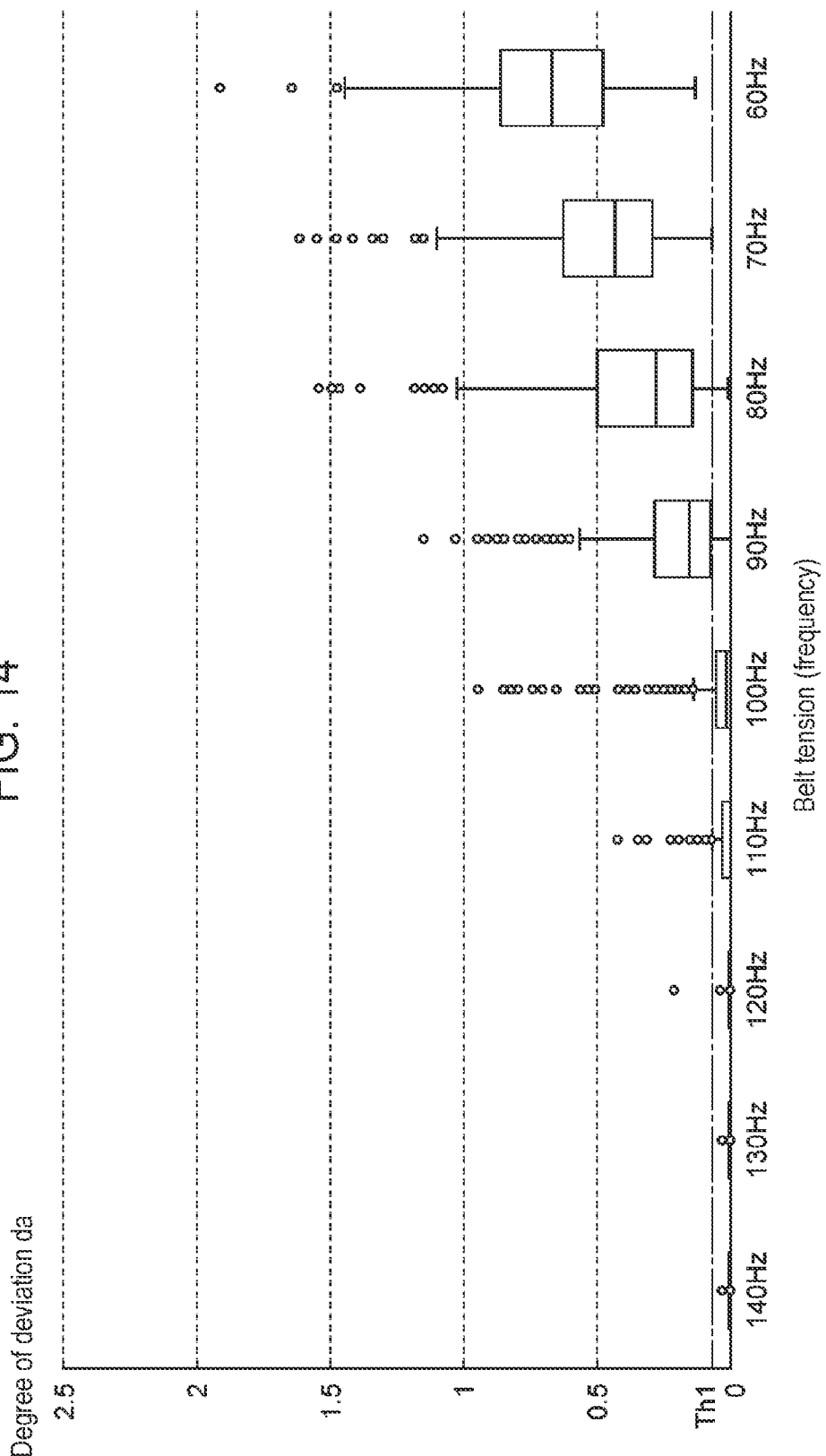
FIG. 14 is a graph showing an example of verification results of a monitoring model.

Next, with reference to FIGS. 14 and 15, the verification results on the determination for a transfer mechanism using the monitoring model will be described. FIG. 14 illustrates the results of calculating the degrees of deviation da using a monitoring model AE on the basis of a plurality of (500) pieces of normal operation data for verification when the belt 33e of the driver 33 has different tensions.

In the example illustrated in FIG. 14, respective degrees of deviation da when the frequency corresponding to the tension of the belt 33e of the transfer mechanism is changed in units of 10 Hz in the range of 140 Hz to 60 Hz are calculated. A lower frequency indicates lowered tension. Lowered tension indicates that the belt 33e of the transfer mechanism is deteriorated. In FIG. 14, the distribution of calculation results on the degree of deviation da for each tension (frequency) is shown as a box-and-whisker graph. From the calculation results shown in FIG. 14, it can be seen that as the tension decreases, the maximum values of degrees of deviation da increase, and the degrees of deviation da included in respective interquartile ranges indicated by boxes increase.

Figure 15:
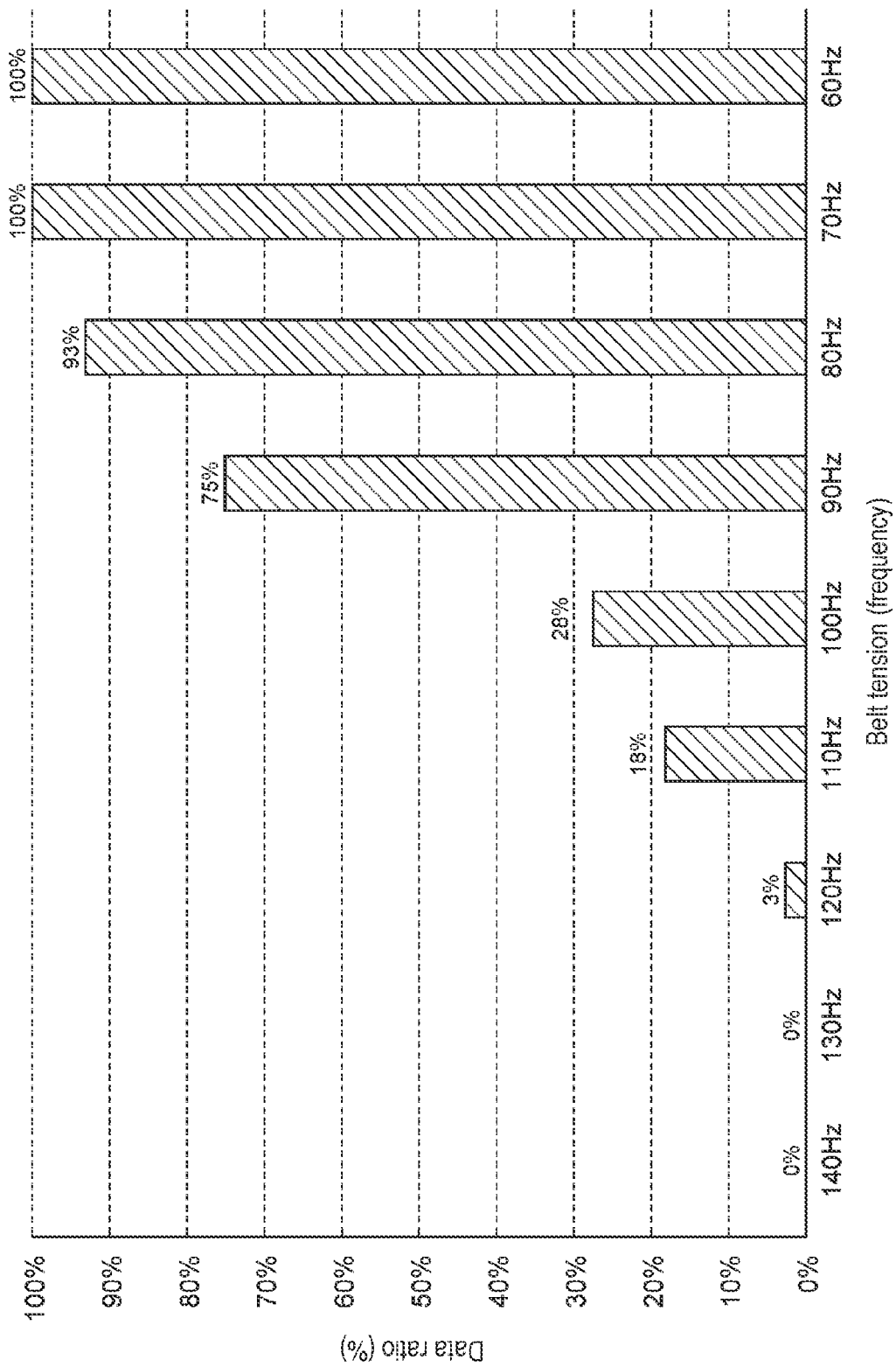
FIG. 15 is a graph showing an example of verification results of a monitoring model.

FIG. 15 shows data ratios in each of which the degree of deviation da exceeds the threshold Th1 under the same condition as the verification result of the degree of deviation da shown in FIG. 14. As shown in FIG. 15, when the frequency is 90 Hz or less, the data ratio is 75% or more, and when the frequency is 80 Hz or less, the data ratio is 90% or more. The lower the frequency (tension), the closer the driver 33 is to an abnormal state. Therefore, for example, by setting the threshold Th2 to 75%, the determination part 78 may determine that the driver 33 is approaching the abnormal state. Alternatively, by setting the threshold Th2 to 90%, the determination part 78 may determine that the driver 33 is approaching the abnormal state.

[Action]

According to the above-described examples, the state of the transfer device 10 is determined on the basis of output data obtained by inputting evaluation data derived from operation data acquired by the acquisition part into a monitoring model at the time of evaluation of the transfer device 10. In this case, a significantly different value may be output depending on whether the normal operation data is input to the monitoring model generated through machine learning based on the normal operation data using the auto-encoder, or whether operation data at the time of abnormal operation of the transfer device 10 is input to the monitoring model. Therefore, it is possible to determine the state of the transfer device 10 with ease and high accuracy on the basis of the first output data from the monitoring model.

According to the above-described examples, the determination part 77 performs a process of acquiring a permissible error Ea based on an error Eb between the normal operation data and the output data obtained by inputting the normal operation data into the monitoring model (step S15). In addition, by comparing the error Ed between the evaluation data and the output data with the permissible error Ea, the determination part 77 performs a process of acquiring a degree of deviation da from the permissible error Ea and a process of determining the state of the transfer device 10 on the basis of the degree of deviation da (step S24).

In this case, the monitoring model is generated through machine learning using the auto-encoder such that the error between the normal operation data and the output data from the monitoring model to which the normal operation data is input becomes extremely small. In other words, when operation data at the time of abnormal operation of the transfer device 10 is input to the monitoring model, the error between the operation data at the time of abnormal operation and the output data from the monitoring model becomes large. Therefore, it is possible to determine the state of the transfer device 10 with ease and high accuracy.

According to the above-described examples, the permissible error Ea is in the range of $\mu_1 \pm 3\sigma_1$. In this case, the permissible error is in the range excluding an abnormal value that may be included in the normal operation data. By comparing with an error Ed using such a permissible error, a large error is distinguished from the values included in the error Ed with high accuracy. Therefore, it is possible to more accurately determine the abnormal operation of the transfer device 10.

According to the above-described examples, a degree of deviation da at the time of evaluation is a value obtained by calculating a root mean squared error on the basis of the error Ed at the time of evaluation and the permissible error Ea. In this case, the degree of deviation da indicates how much the evaluation data has varied from the permissible error as a whole. By determining the state of the transfer device 10 based on such a deviation degree da, it is possible to further improve the accuracy of abnormality determination.

According to the above-described examples, determining the state of the transfer device 10 on the basis of the degree of deviation da at the time of evaluation includes making a determination on the basis whether or not the deviation degree da exceeds a predetermined threshold Th1. In this case, it is possible to determine the state of the transfer device 10 through an extremely simple method of comparing the degree of deviation da with the threshold value Th1.

According to the above-described examples, the threshold Th1 is a value obtained by $3\sigma_2$. By comparing with the degree of deviation da at the time of evaluation using such a threshold Th1, among the obtained degrees of deviation, those exceeding a degree of deviation capable of existing in the normal operation data is distinguished with high accuracy. Therefore, it is possible to more accurately determine the abnormal operation of the transfer device 10.

According to the above-described examples, the degree of deviation dr at the time of learning may be a value obtained by calculating a root mean squared error on the basis of the error Eb at the time of normal operation and the permissible error Ea. In this case, the degree of deviation dr at the time of normal operation indicates how much the error Eb at the time of normal operation has varied from the permissible error Ea as a whole. By determining the state of the transfer device 10 using the threshold value Th1 obtained on the basis of the degree of deviation degree dr at the time of normal operation, it is possible to further improve the accuracy of abnormality determination.

According to the above-described examples, the storage part 72 configured to store a data group in which determination results on the state of the transfer device 10 made on the basis of the degree of deviation degree at the time of evaluation have been accumulated for a predetermined period of time, and the determination part 78 configured to determine the degree to which the transfer device 10 is approaching an abnormal state on the basis of the ratio of data in which the degree of deviation da exceeds a predetermined threshold Th1 in the data group may be further provided. In this case, it is possible to determine the maintenance time of the transfer device 10 on the basis of the determination results made by the determination part 78.

According to the above-described examples, the adjustment part 75 configured to adjust the number of data pieces of the operation data acquired by the acquisition part 74 to a predetermined constant number is provided. In this case, the subsequent data processing can be easily executed.

According to the above-described examples, the transfer device 10 includes the arm 34 configured to support the wafer W and the motor 33f configured to operate the arm 34, and the acquisition part 74 acquires a torque signal of the motor as operation data. In this case, it is possible to determine the abnormal operation of the transfer device 10 using the torque signal that can be easily acquired as the operation data of the transfer device 10.

[Modification]

It shall be understood that the disclosure in this specification is exemplary in all respects and is not restrictive. Various omissions, substitutions, changes, etc. may be made to the above-described examples without departing from the scope of the claims and the gist thereof.

(1) The target of state determination by the state determination part 70 may be the holder 30 configured to transfer the wafer W in the direction indicated by arrow D1 in the transfer device 10. Alternatively, the target of state determination may be a drive mechanism configured to drive the rotation shaft 32, or a mechanism configured to move the arm 34 along the up-down direction.

(2) The state determination part 70 does not have to include the determination part 78. In this case, the state determination part 70 may perform only primary determination on the basis of the degree of deviation da at the time of evaluation in one operation of the transfer mechanism. The state determination part 70 may only store the primary determination result in the storage part 72, or may output the primary determination result.

(3) The permissible error Ea is not limited to the above-described examples. The permissible error Ea may be, for example, in the range of $\mu_1 \pm 2\sigma_1$, may be in the range of $\mu_1 \pm \sigma_1$, or may be in the range of $\mu_1 \pm n \times \sigma_1$ (n is an arbitrary number).

(4) The threshold Th1 is not limited to the values obtained through the above-described examples. The threshold Th1 may be a value obtained by $n1 \times \sigma_2$ (n1 is an arbitrary positive number).

(5) The state determination part 70 (a state determination device) may be accommodated in a housing different from the controller 60, and may be configured as a computer (circuit) different from the controller 60. The state determination part 70 may be configured with a computer or a server device that can be connected to the substrate processing apparatus 2 from the outside. As described above, the state determination part 70 does not need to be integrally configured with the substrate processing apparatus 2 or the controller 60, and may be implemented as an external device capable of being communication-connected in a wired or wireless manner as needed.

(6) The model generation part 76 may be implemented using another controller different from the controller 60. For example, a server device or the like separate from the substrate processing apparatus 2 may include the other controller. In this case, the controller 60 may acquire a monitoring model generated by the model generation part 76 of the other controller by communicating with the other controller via a predetermined communication method such as a network.

OTHER EXAMPLES

Example 1

The state determination device 70 according to an example of the present disclosure determines the state of the drive mechanism 10 configured to operate while holding the substrate W in the substrate processing apparatus 2. The state determination device 70 includes: the acquisition part 74 configured to acquire operation data of the drive mechanism 10; the model generation part 76 configured to generate a monitoring model for the drive mechanism 10 by executing machine learning using an auto-encoder on the basis of normal operation data that is derived from the operation data acquired by the acquisition part 74 when the drive mechanism 10 is operating normally; and the first determination part 77 configured to determine the state of the drive mechanism 10 based on first output data obtained by inputting, to the monitoring model, evaluation data that is derived from the operation data acquired by the acquisition part 74 when the drive mechanism 10 is being evaluated. In this case, a significantly different value may be output depending on whether the normal operation data is input to the monitoring model generated through machine learning based on the normal operation data using the auto-encoder, or whether operation data at the time of abnormal operation of the drive mechanism is input to the monitoring model. Therefore, it is possible to determine the state of the drive mechanism with ease and high accuracy on the basis of the first output data from the monitoring model.

Example 2

In the device of Example 1, the first determination part 77 may perform a process of acquiring a permissible error Ea on the basis of the first error Eb between the normal operation data and a second output data obtained by inputting the normal operation data into the monitoring model, and a process of acquiring a first degree of deviation da from the permissible error Ea by comparing a second error Ed between the evaluation data and the first output data with the permissible error Ea, and a process of determining the state of the drive mechanism 10 on the basis of the first degree of deviation da. In this case, the monitoring model is generated through machine learning using the auto-encoder such that the error between the normal operation data and the output data from the monitoring model to which the normal operation data is input becomes extremely small. In other words, when the operation data at the time of abnormal operation of the drive mechanism is input to the monitoring model, the error between the operation data at the time of abnormal operation and the output data from the monitoring model becomes large. Therefore, it is possible to determine the state of the drive mechanism with ease and high accuracy.

Example 3

In the device of Example 2, the permissible error Ea may be in the range of $\mu_1 \pm 3\sigma_1$ when parameters $\mu_1$ and $\sigma_1$ are the average value of first error Eb and the standard deviation of the first error Eb, respectively. In this case, the permissible error is in the range excluding an abnormal value that may be included in the normal operation data. By comparing with the second error using such a permissible error, a large error is accurately distinguished from the values included in the second error. Therefore, it is possible to more accurately determine the abnormal operation of the drive mechanism.

Example 4

In the device of Example 2 or Example 3, the first degree of deviation may be a value obtained by calculating the root mean squared error (RMSE) on the basis of the second error and the permissible error. In this case, the first degree of deviation indicates how much the evaluation data has varied from the permissible error as a whole. By determining the state of the drive mechanism on the basis of the first degree of deviation, it is possible to further improve the accuracy of abnormality determination.

Example 5

In any of the devices of Examples 2 to 4, determining the state of the drive mechanism 10 on the basis of the first degree of deviation da may include determining whether or not the first degree of deviation da exceeds a predetermined threshold Th1. In this case, it is possible to determine the state of the drive mechanism through an extremely simple method of comparing the first degree of deviation with the threshold.

Example 6

In the device of Example 5, the threshold Th1 may be a value obtained by $3\sigma_2$ when $\sigma_2$ is the standard deviation of a second degree of deviation dr from the permissible error Ea, which is obtained on the basis of comparison between the first error Eb and the permissible error Ea. By comparing with the first degree of deviation using such a threshold, among the obtained first degrees of deviation, those exceeding a degree of deviation capable of existing in the normal operation data is distinguished with high accuracy. Therefore, it is possible to more accurately determine the abnormal operation of the drive mechanism.

Example 7

In the device of Example 6, the second degree of deviation dr may be a value obtained by calculating the root mean squared error (RMSE) on the basis of the first error Eb and the permissible error Ea. In this case, the second degree of deviation indicates how much the first error has varied from the permissible error as a whole. By determining the state of the drive mechanism using a threshold obtained on the basis of the second degree of deviation, it is possible to further improve the accuracy of abnormality determination.

Example 8

The device of any one of Examples 5 to 7 may further include: the storage part 72 configured to store a data group in which results of determination of the state of the drive mechanism 10 based on the first degree of deviation da are accumulated for a predetermined period of time; and the second determination part 78 configured to determine a degree to which the drive mechanism 10 is approaching an abnormal state on the basis of a ratio of data in which the first degree of deviation da exceeds a predetermined threshold Th1 in the data group. In this case, it is possible to determine the maintenance time of the drive mechanism on the basis of the determination result by the second determination part.

Example 9

The device according to any one of Examples 1 to 8 further includes the adjustment part 75 configured to adjust the number of data pieces of the operation data acquired by the acquisition part 74 to a predetermined number, wherein the normal operation data may be data in which the number of data pieces of the operation data acquired by the acquisition part 74 when the drive mechanism 10 is operating normally is adjusted to the predetermined number by the adjustment part 75, and wherein the evaluation data may be data in which the number of data pieces of the operation data acquired by the acquisition part 74 when the drive mechanism 10 is being evaluated is adjusted to the predetermined number by the adjustment part 75. In this case, the subsequent data processing can be easily executed.

Example 10

In the device of any of Examples 1 to 9, the drive mechanism 10 may include the support member 34 configured to support the substrate W and the motor 33f configured to operate the support part, and the acquisition part 74 may be configured to acquire the torque signal of the motor 33f as the operation data. In this case, it is possible to determine the abnormal operation of the drive mechanism using the torque signal that can be easily acquired as the operation data of the drive mechanism.

Example 11

A state determination method according to another example of the present disclosure includes: generating a monitoring model for the drive mechanism 10 configured to operate while holding the substrate W by executing machine learning using an auto-encoder on the basis of normal operation data that is derived from operation data when the drive mechanism 10 is operating normally; and determining the state of the drive mechanism 10 based on first output data obtained by inputting, to the monitoring model, evaluation data that is derived from the operation data when the drive mechanism is being evaluated. In this case, the same effects as those in Example 1 are obtained.

Example 12

A computer-readable recording medium according to another example of the present disclosure records a program for causing the state determination device 70 to execute the method of Example 11. In this case, the same effects as those of the method of Example 11 are obtained. In the present specification, the computer-readable recording medium includes a non-transitory computer recording medium (e.g., various main storage devices or auxiliary storage devices) or a propagation signal (a transitory computer recording medium) (e.g., a data signal that can be provided via a network).

EXPLANATION OF REFERENCE NUMERALS

2: substrate processing apparatus, 10: transfer device, 33: driver, 34: arm, 60: controller, 73: state determination part, 74: acquisition part, 75: adjustment part, 77, 78: determination part

What is claimed is:

1. A state determination device for determining a state of a drive mechanism configured to operate while holding a substrate in a substrate processing apparatus, the state determination device comprising:
   an acquisition part configured to acquire operation data for the drive mechanism;
   a storage part configured to store a monitoring model for the drive mechanism generated by executing machine learning using an auto-encoder based on normal operation data for the drive mechanism; and
   a first determination part configured to determine the state of the drive mechanism based on first output data obtained by inputting, to the monitoring model, evaluation data that is derived from the operation data acquired by the acquisition part when the drive mechanism is being evaluated, and configured to execute:
   a process of acquiring a permissible error based on a first error between the normal operation data and a second output data obtained by inputting the normal operation data to the monitoring model;
   a process of acquiring a first degree of deviation from the permissible error by comparing a second error between the evaluation data and the first output data with the permissible error; and a process of determining the state of the drive mechanism based on the first degree of deviation, wherein determining the state of the drive mechanism based on the first degree of deviation includes determining based on whether or not the first degree of deviation exceeds a predetermined threshold, and wherein the threshold is a value obtained by $3\sigma_2$ when a parameter $\sigma_2$ is a standard deviation of a second degree of deviation from the permissible error, which is obtained based on comparison between the first error and the permissible error.

2. The state determination device of claim 1, wherein the permissible error is in a range of $\mu_1 \pm 3\sigma_1$ when parameters $\mu_1$ and $\sigma_1$ are an average value of the first error and a standard deviation of the first error, respectively.

3. The state determination device of claim 1, wherein the first degree of deviation is a value obtained by calculating a root mean squared error (RMSE) based on the second error and the permissible error.

4. The state determination device of claim 1, wherein the second degree of deviation is a value obtained by calculating a root mean squared error (RMSE) based on the first error and the permissible error.

5. The state determination device of claim 1, further comprising:

an adjustment part configured to adjust a number of data pieces of the operation data acquired by the acquisition part to a predetermined number, wherein the normal operation data is data in which the number of data pieces of the operation data acquired by the acquisition part when the drive mechanism is operating normally is adjusted to the predetermined number by the adjustment part, and the evaluation data is data in which the number of data pieces of the operation data acquired by the acquisition part when the drive mechanism is being evaluated is adjusted to the predetermined number by the adjustment part.

6. The state determination device of claim 1, wherein the drive mechanism includes:

a support member configured to support the substrate; and a motor configured to operate the support member, and wherein the acquisition part is configured to acquire a torque signal of the motor as the operation data.

7. The state determination device of claim 1, further comprising:

a model generation part configured to generate the monitoring model for the drive mechanism by executing the machine learning using the auto-encoder based on normal operation data that is derived from the operation data acquired by the acquisition part when the drive mechanism is operating normally.

8. A state determination device for determining a state of a drive mechanism configured to operate while holding a substrate in a substrate processing apparatus, the state determination device comprising:

an acquisition part configured to acquire operation data for the drive mechanism;

a storage part configured to store a monitoring model for the drive mechanism generated by executing machine learning using an auto-encoder based on normal operation data for the drive mechanism; and a first determination part configured to determine the state of the drive mechanism based on first output data obtained by inputting, to the monitoring model, evaluation data that is derived from the operation data acquired by the acquisition part when the drive mechanism is being evaluated, and configured to execute:

a process of acquiring a permissible error based on a first error between the normal operation data and a second output data obtained by inputting the normal operation data to the monitoring model;

a process of acquiring a first degree of deviation from the permissible error by comparing a second error between the evaluation data and the first output data with the permissible error; and a process of determining the state of the drive mechanism based on the first degree of deviation;

wherein determining the state of the drive mechanism based on the first degree of deviation includes determining based on whether or not the first degree of deviation exceeds a predetermined threshold, wherein the storage part is further configured to store a data group in which results of determination of the state of the drive mechanism based on the first degree of deviation are accumulated for a predetermined period of time, and wherein the state determination device further comprises a second determination part configured to determine a degree to which the drive mechanism is approaching an abnormal state based on a ratio of data in which the first degree of deviation exceeds the threshold in the data group.

9. The state determination device of claim 8, wherein the permissible error is in a range of $\mu_1 + 3\sigma_1$ when parameters $\mu_1$ and $\sigma_1$ are an average value of the first error and a standard deviation of the first error, respectively.

10. The state determination device of claim 8, wherein the first degree of deviation is a value obtained by calculating a root mean squared error (RMSE) based on the second error and the permissible error.

11. The state determination device of claim 8, wherein the threshold is a value obtained by $3\sigma_2$ when a parameter $\sigma_2$ is a standard deviation of a second degree of deviation from the permissible error, which is obtained based on comparison between the first error and the permissible error.

12. The state determination device of claim 11, wherein the second degree of deviation is a value obtained by calculating a root mean squared error (RMSE) based on the first error and the permissible error.

13. The state determination device of claim 8, further comprising:

an adjustment part configured to adjust a number of data pieces of the operation data acquired by the acquisition part to a predetermined number, wherein the normal operation data is data in which the number of data pieces of the operation data acquired by the acquisition part when the drive mechanism is operating normally is adjusted to the predetermined number by the adjustment part, and the evaluation data is data in which the number of data pieces of the operation data acquired by the acquisition part when the drive mechanism is being evaluated is adjusted to the predetermined number by the adjustment part.

14. The state determination device of claim 8, wherein the drive mechanism includes:

a support member configured to support the substrate; and a motor configured to operate the support member, and wherein the acquisition part is configured to acquire a torque signal of the motor as the operation data.

15. The state determination device of claim 8, further comprising:
  a model generation part configured to generate the monitoring model for the drive mechanism by executing the machine learning using the auto-encoder based on normal operation data that is derived from the operation data acquired by the acquisition part when the drive mechanism is operating normally.

\* \* \* \* \*

UNITED STATES PATENT AND TRADEMARK OFFICE
CERTIFICATE OF CORRECTION

PATENT NO. : 12,176,227 B2
APPLICATION NO. : 17/598077
DATED : December 24, 2024
INVENTOR(S) : Junnosuke Maki et al.

Page 1 of 1

It is certified that error appears in the above-identified patent and that said Letters Patent is hereby corrected as shown below:

In the Claims

Claim 9, Column 20, Line 9, please delete the phrase:
"range of $\mu_1+3\sigma_1$ when"

And replace with:
"range of $\mu1\pm3\sigma1$ when"

Signed and Sealed this
Eleventh Day of February, 2025

Coke Morgan Stewart
*Acting Director of the United States Patent and Trademark Office*